(12) United States Patent
Cheng

(10) Patent No.: US 11,980,038 B2
(45) Date of Patent: *May 7, 2024

(54) SEMICONDUCTOR STRUCTURE AND METHOD OF MANUFACTURE

(71) Applicant: TAIWAN SEMICONDUCTOR MANUFACTURING COMPANY LIMITED, Hsin-Chu (TW)

(72) Inventor: Chung-Liang Cheng, Changhua County (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/123,597

(22) Filed: Mar. 20, 2023

(65) Prior Publication Data

US 2023/0232636 A1 Jul. 20, 2023

Related U.S. Application Data

(63) Continuation of application No. 17/394,456, filed on Aug. 5, 2021, now Pat. No. 11,610,904.

(60) Provisional application No. 63/179,157, filed on Apr. 23, 2021.

(51) Int. Cl.
  H10B 53/30 (2023.01)
  H01L 25/00 (2006.01)
  H01L 25/065 (2023.01)
  H01L 25/18 (2023.01)

(52) U.S. Cl.
  CPC ......... H10B 53/30 (2023.02); H01L 25/0657 (2013.01); H01L 25/18 (2013.01); H01L 25/50 (2013.01)

(58) Field of Classification Search
  None
  See application file for complete search history.

(56) References Cited

U.S. PATENT DOCUMENTS 11,610,904 B2 * 3/2023 Cheng ................. H01L 25/0657

* cited by examiner

Primary Examiner — Michael Lebentritt
(74) Attorney, Agent, or Firm — Cooper Legal Group, LLC

(57) ABSTRACT

A semiconductor structure and method for forming the semiconductor are provided. The semiconductor structure includes a first electrode comprising a first portion, a second portion, and a sheet portion connecting the first portion to the second portion. A ferroelectric material is over the sheet portion. A second electrode is over the ferroelectric material.

20 Claims, 19 Drawing Sheets

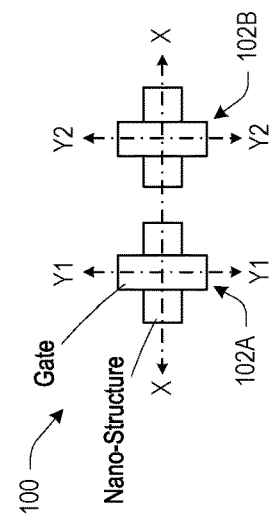
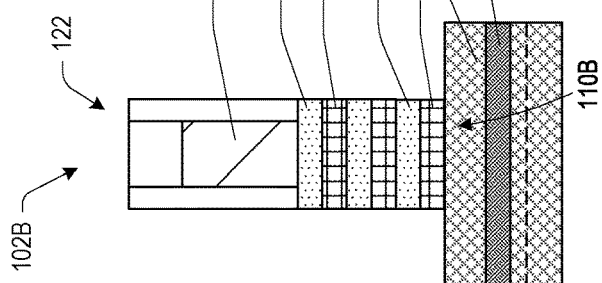
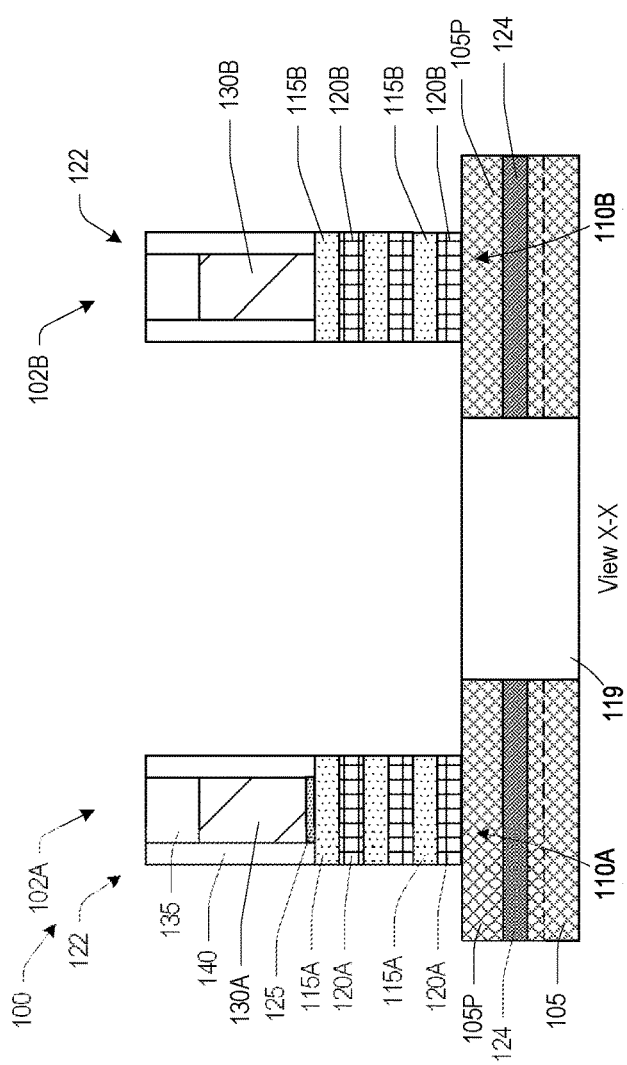
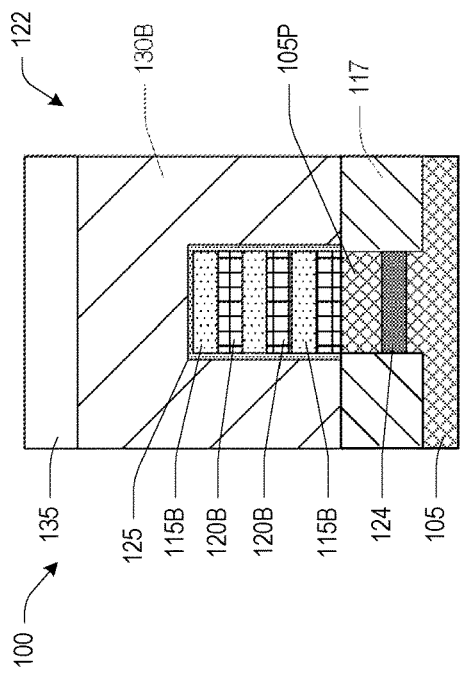
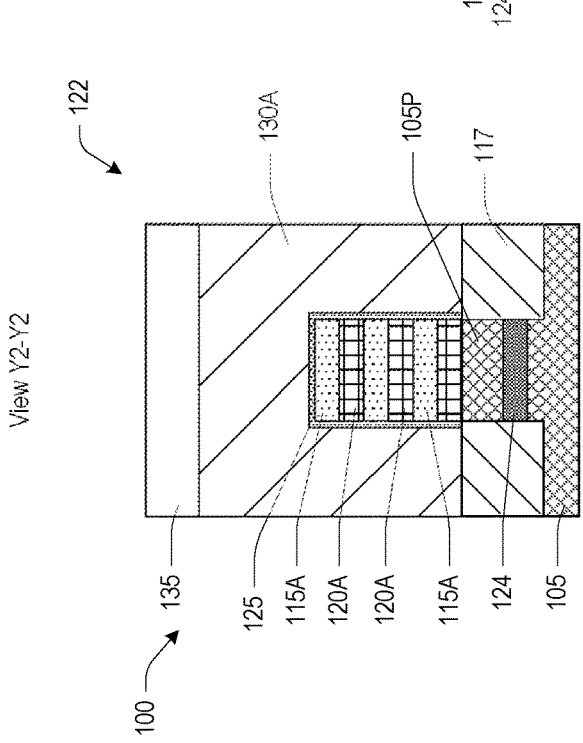
Fig. 2

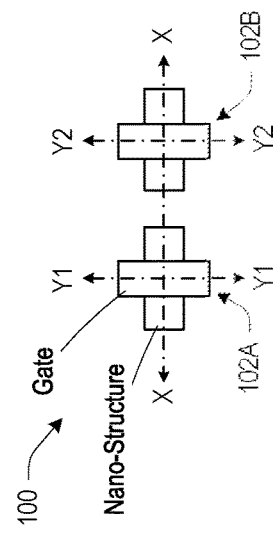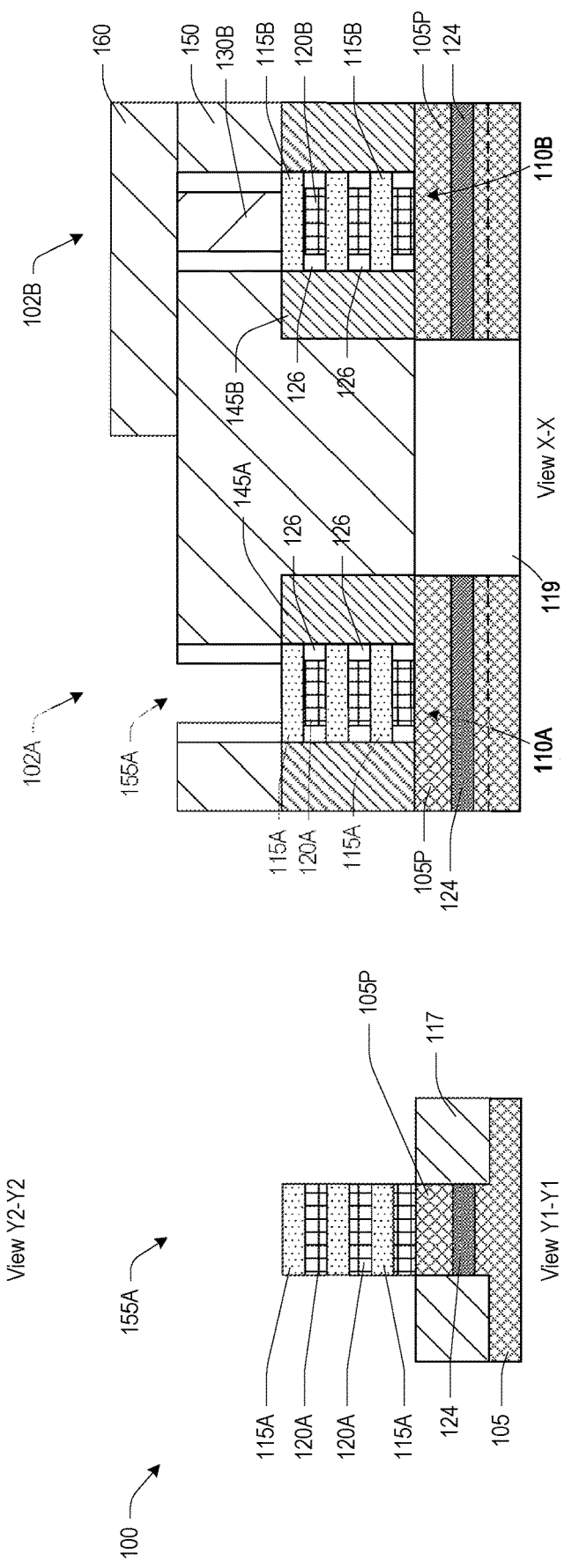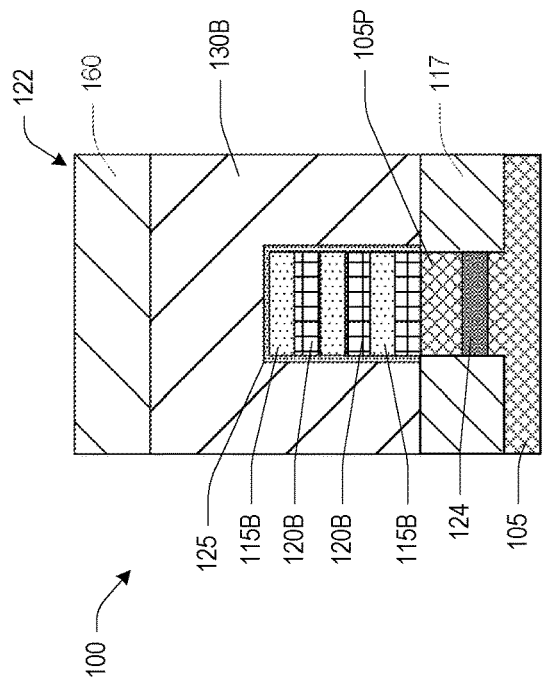
Fig. 5

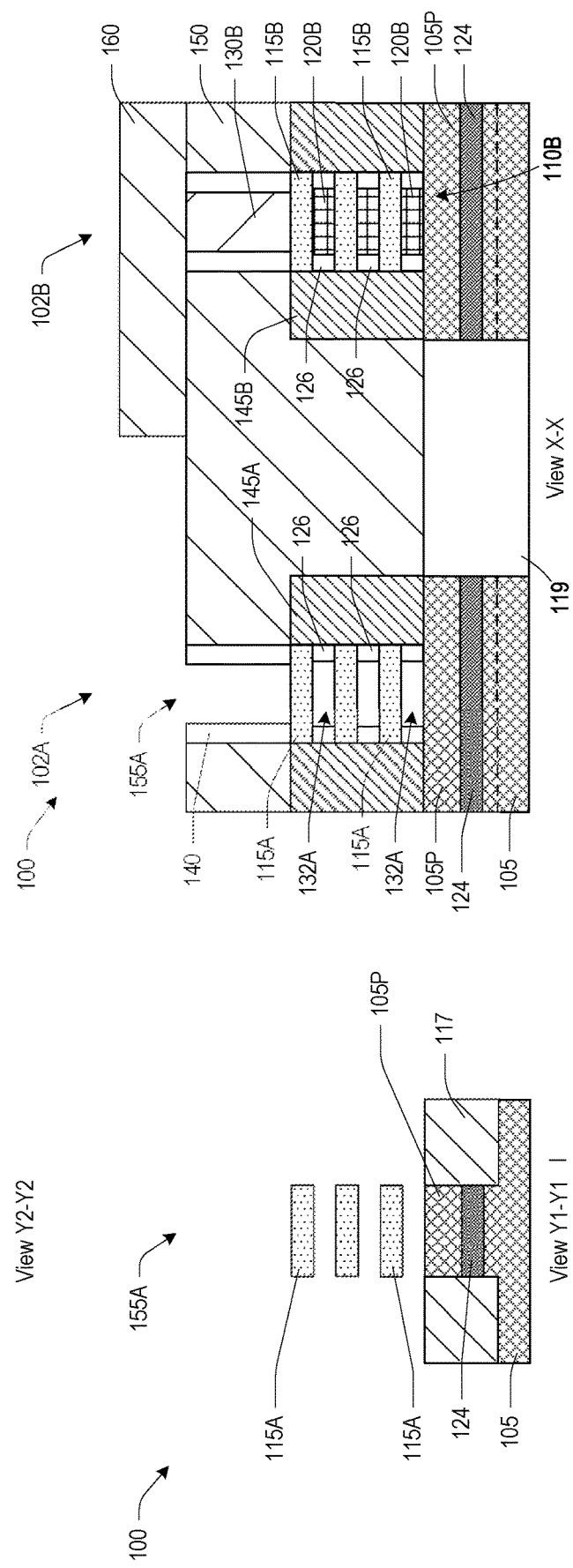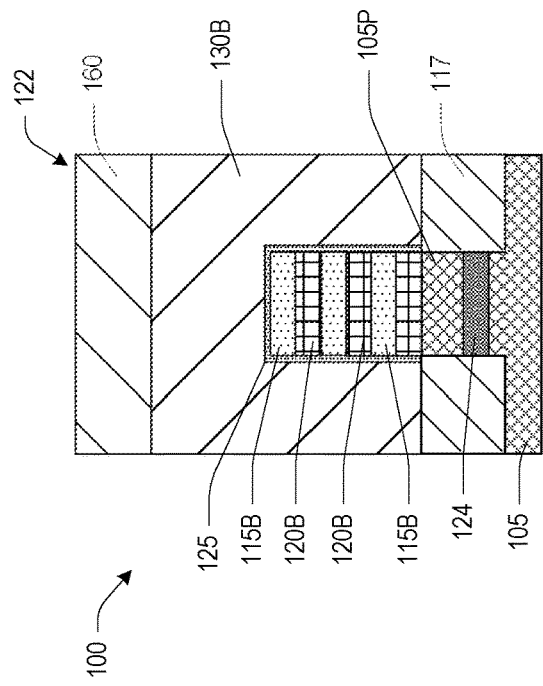
Fig. 6

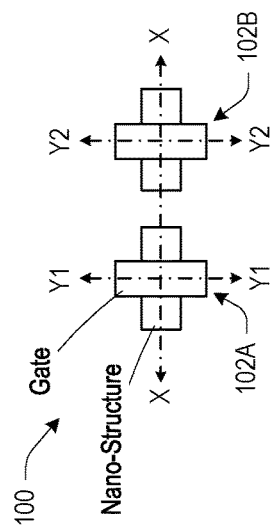
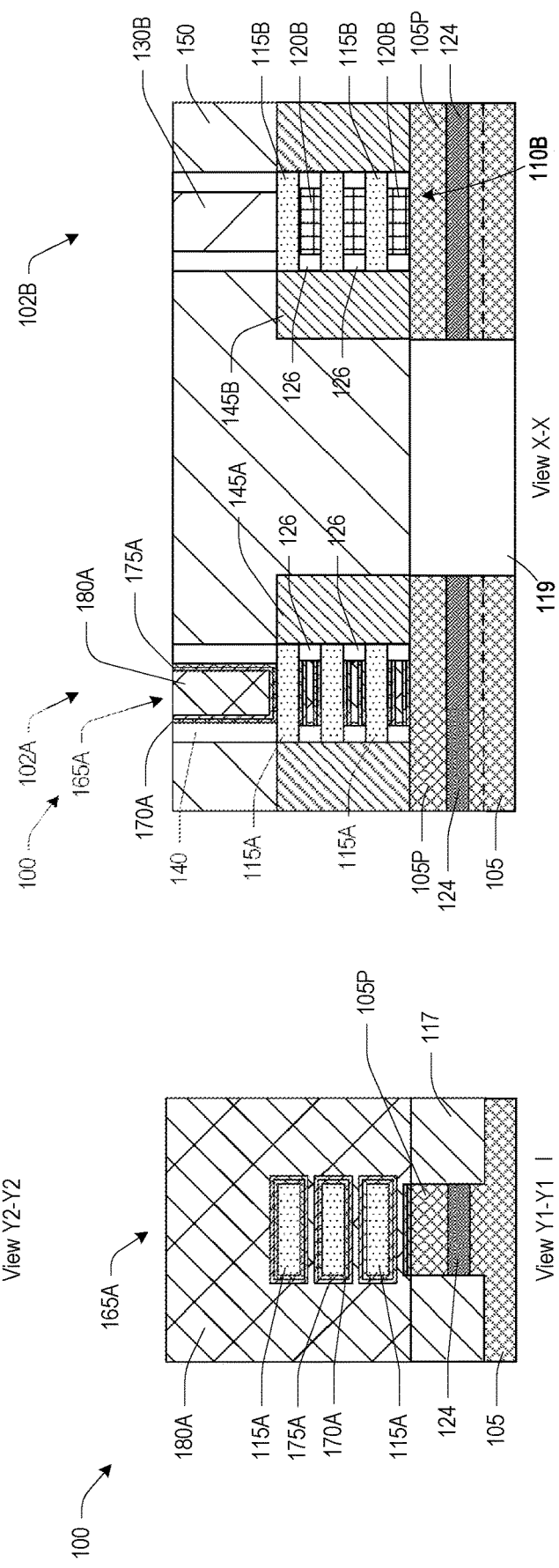
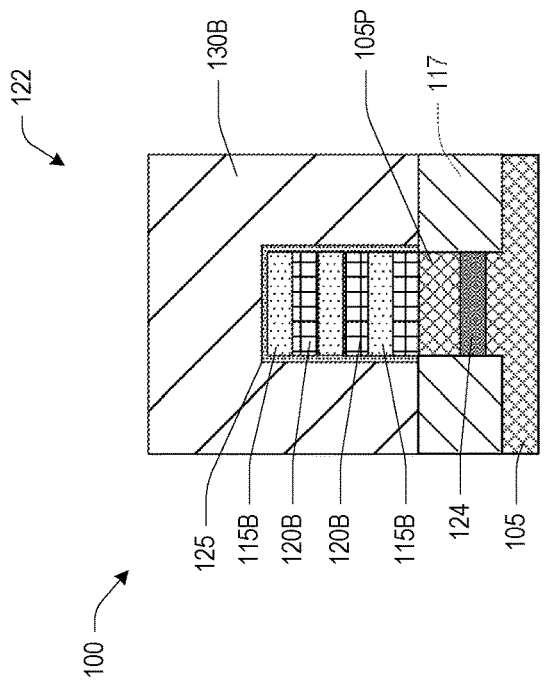
Fig. 7

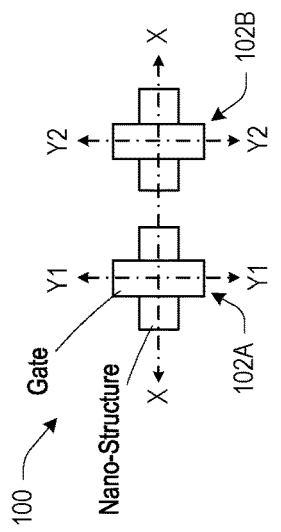
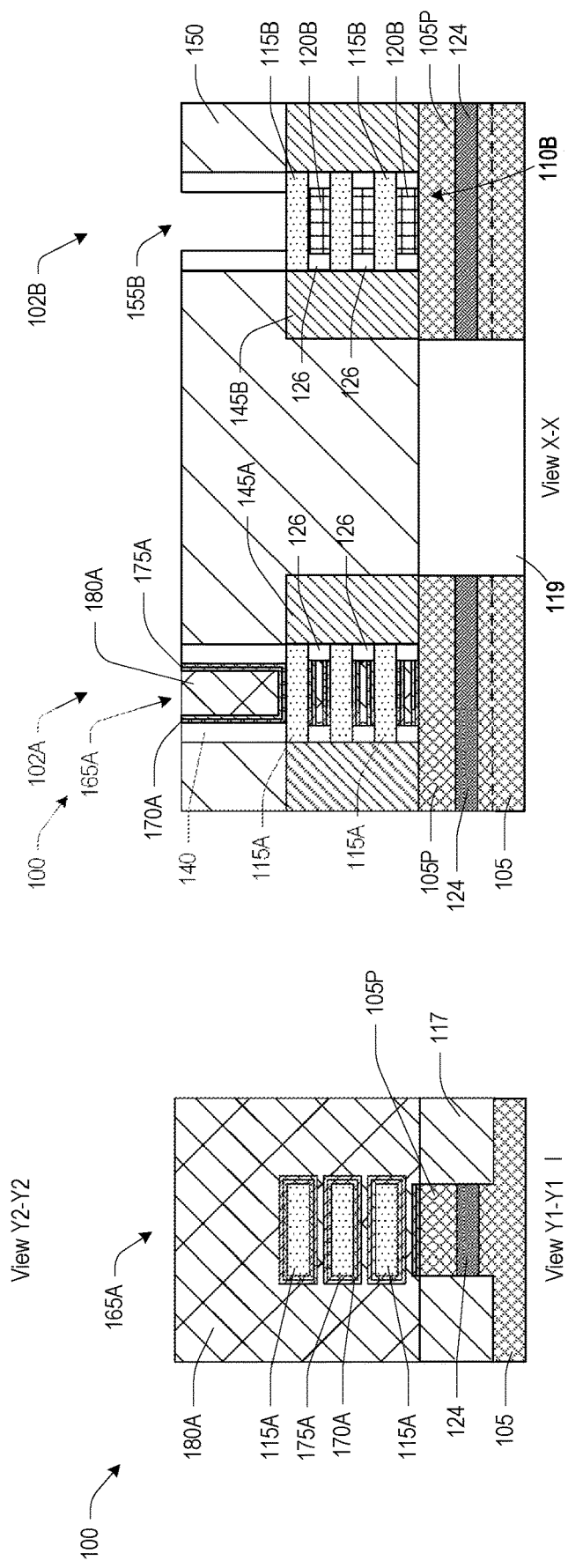
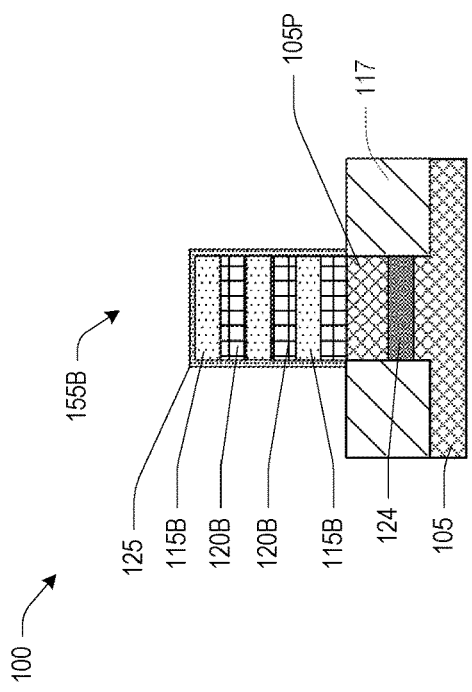
Fig. 8

Fig. 9
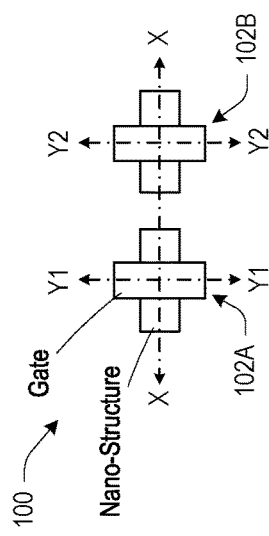
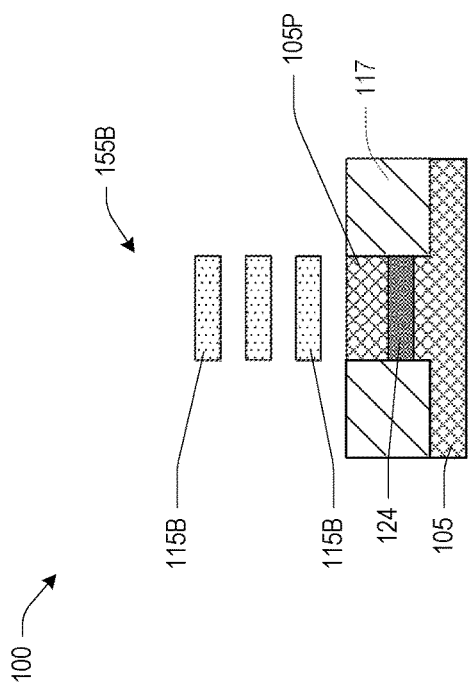
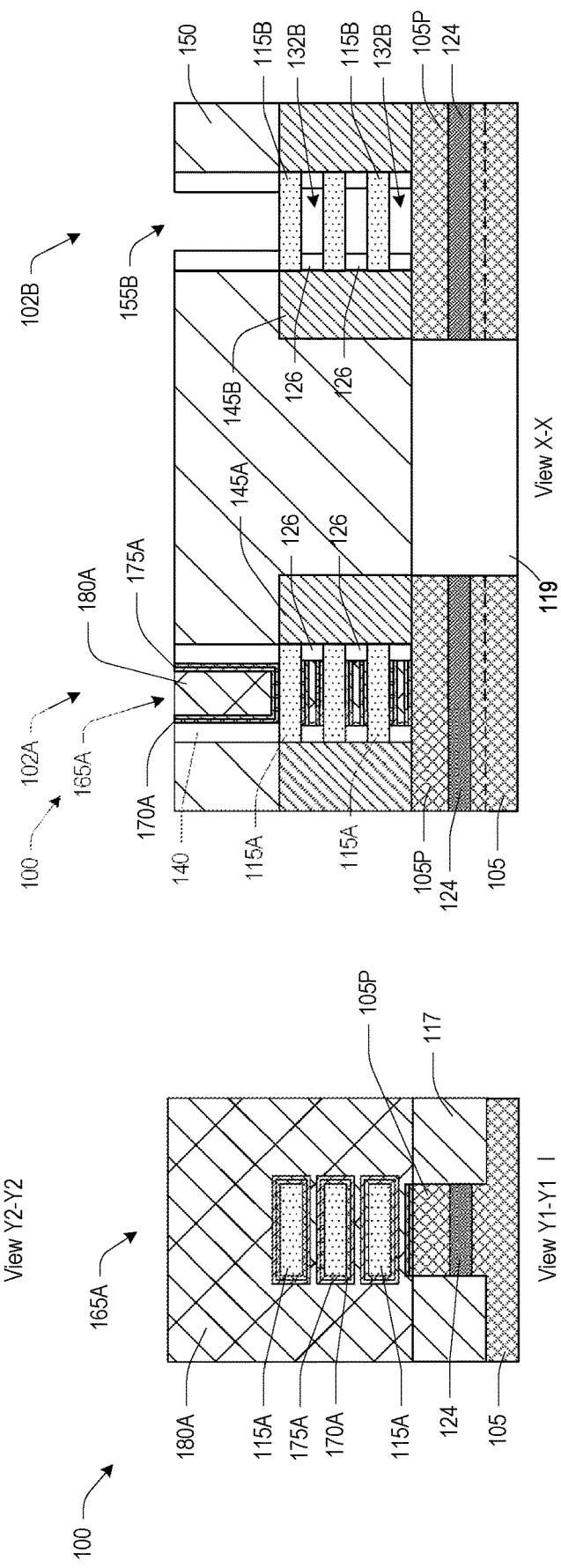

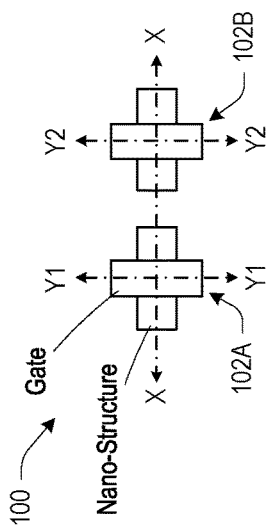
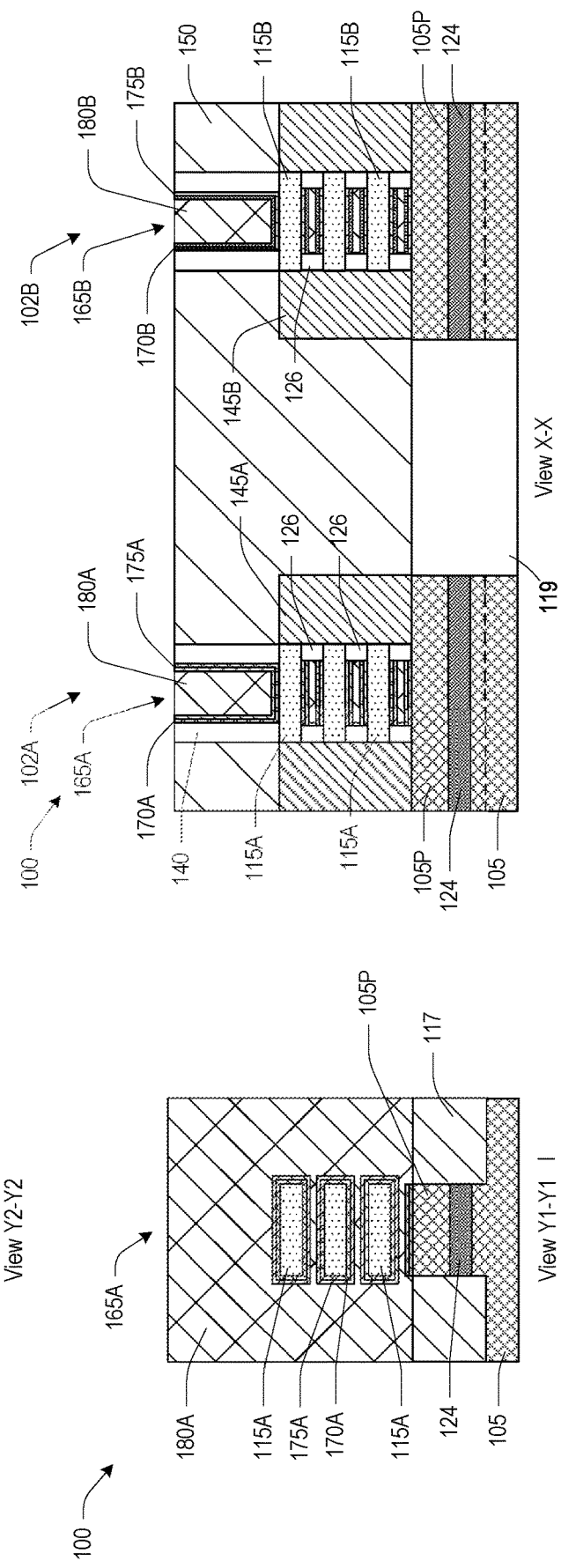
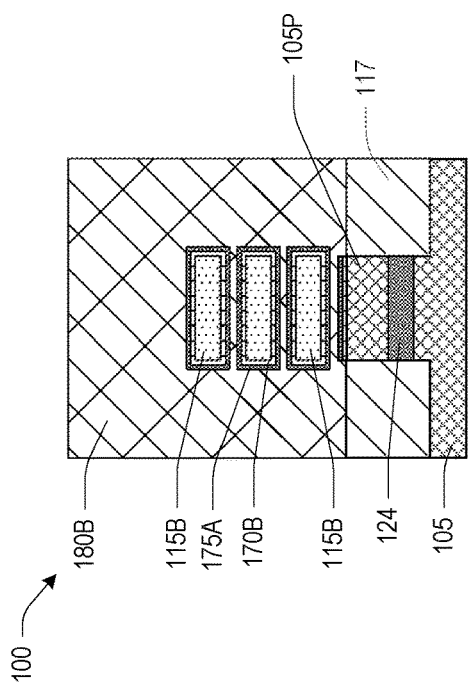
Fig. 10

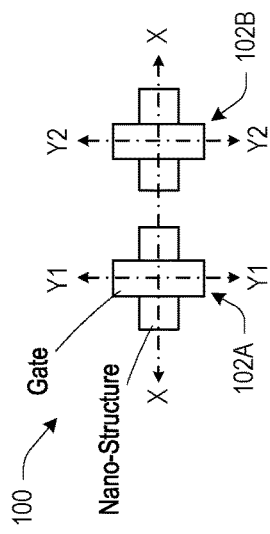
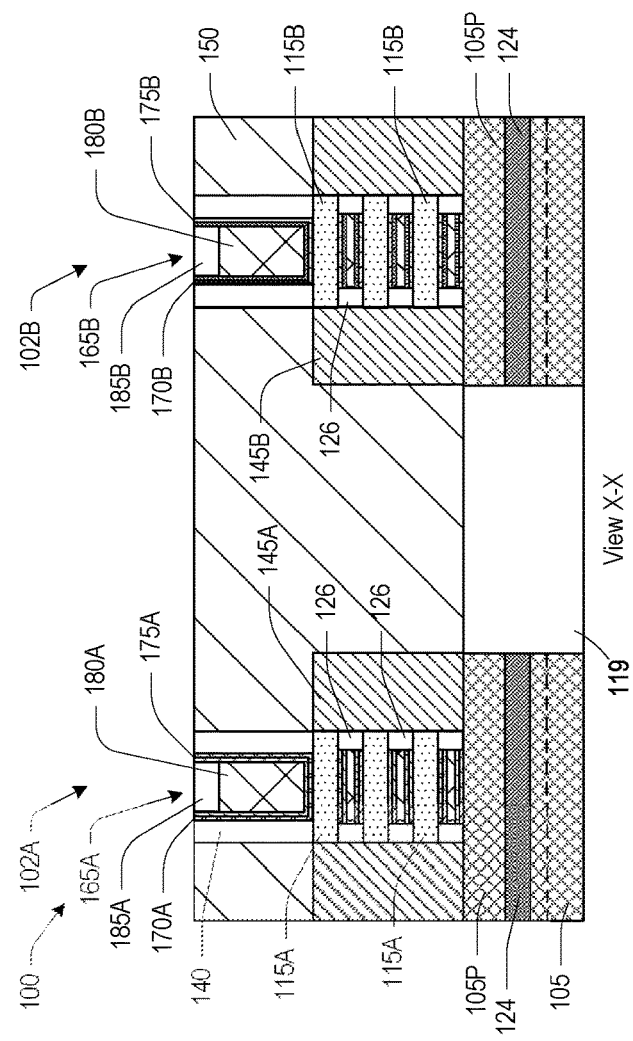
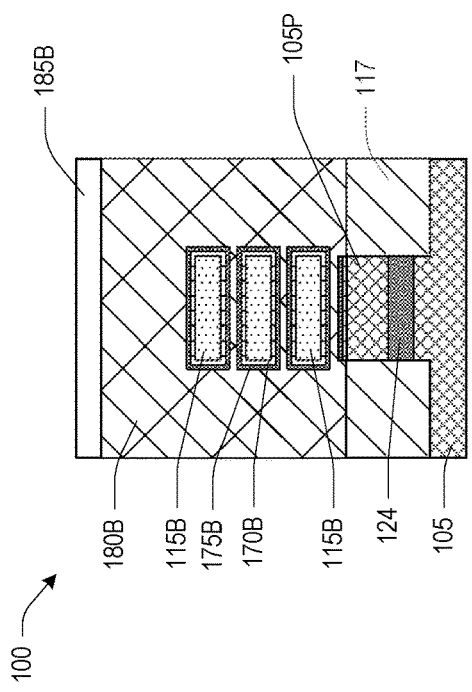
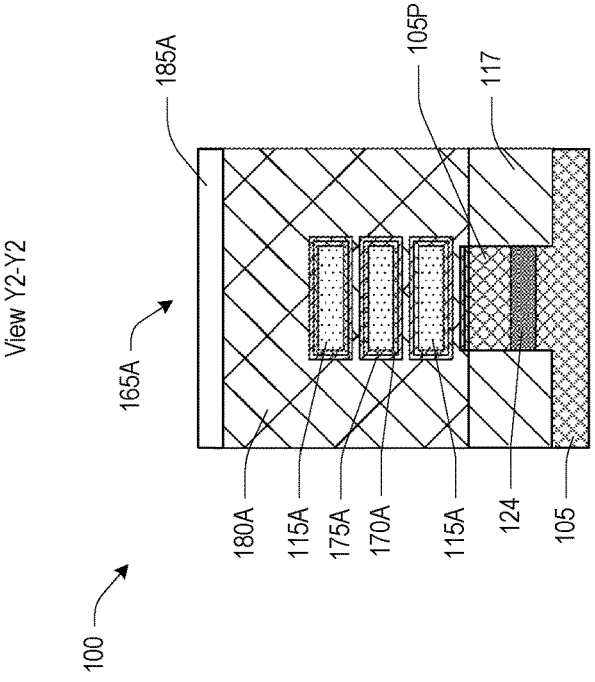
Fig. 11

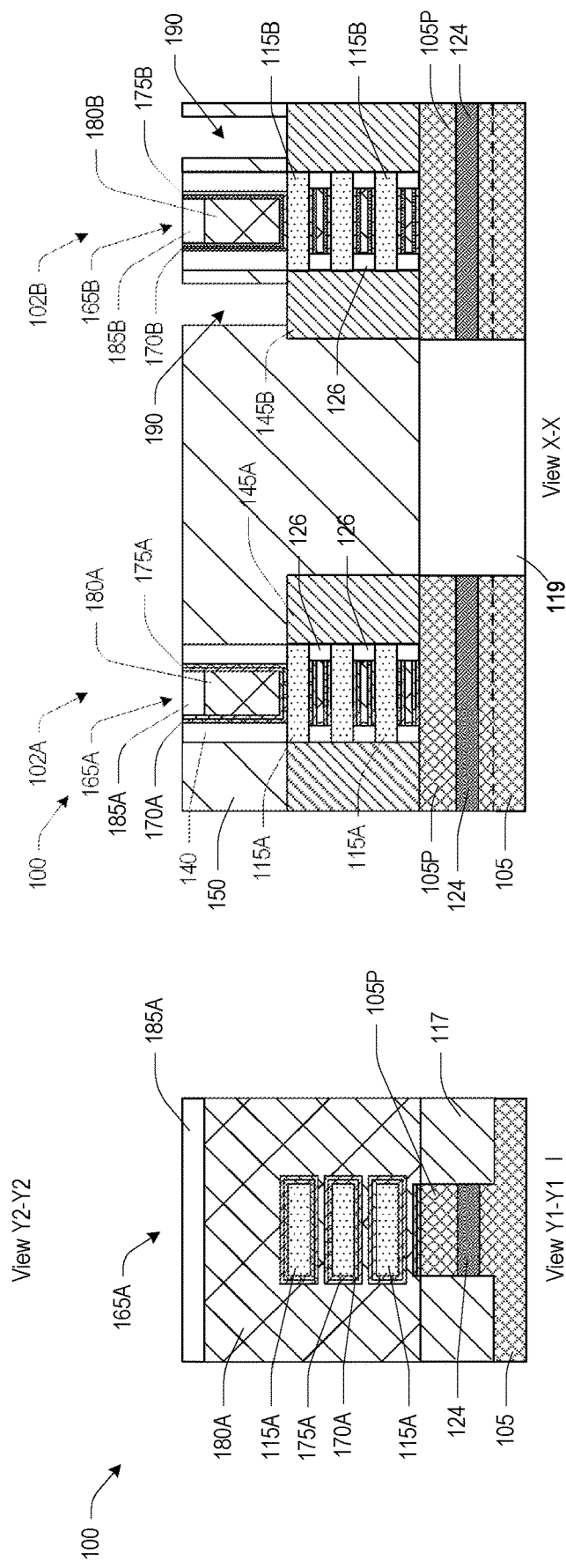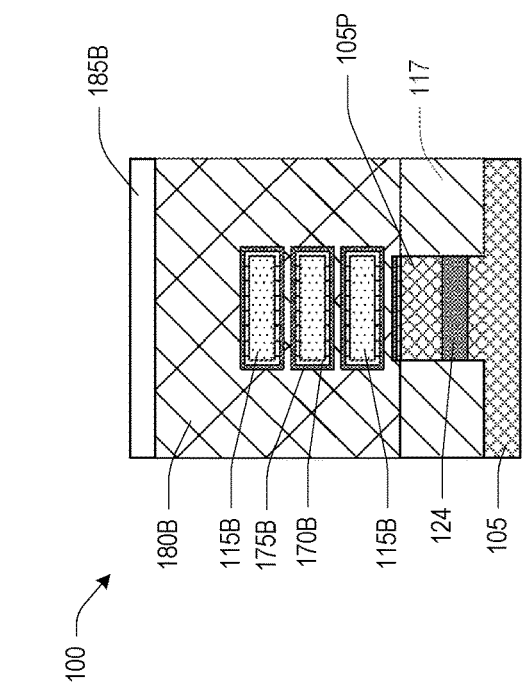
Fig. 12

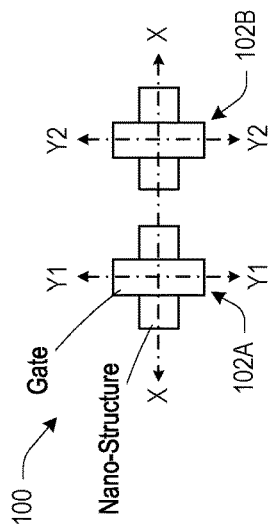
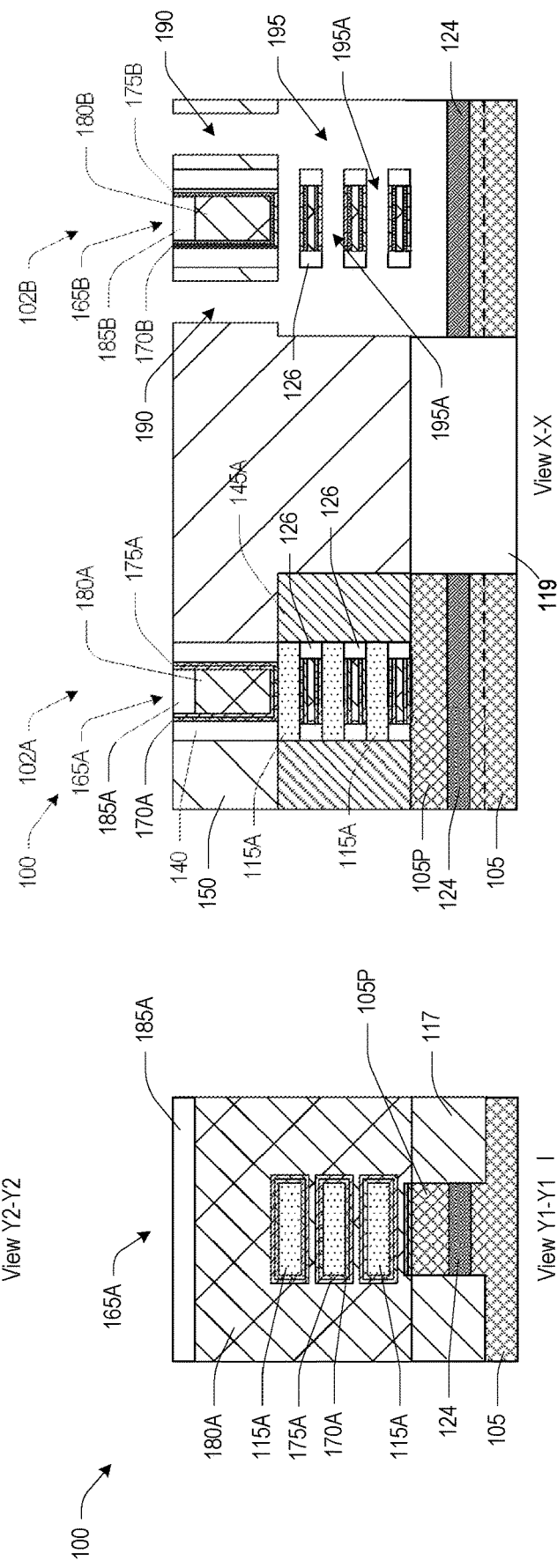
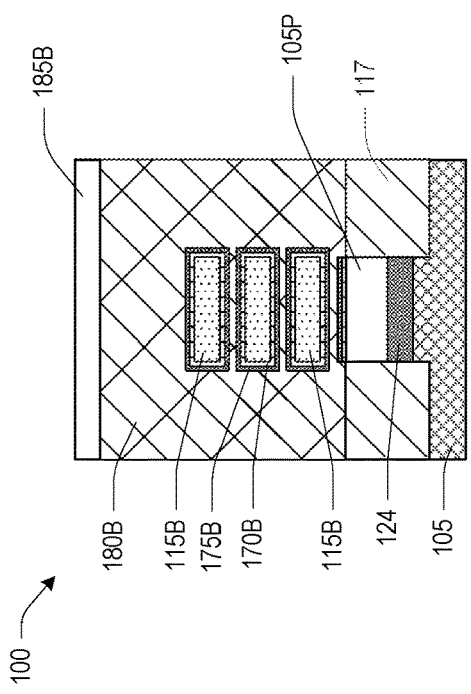
Fig. 13

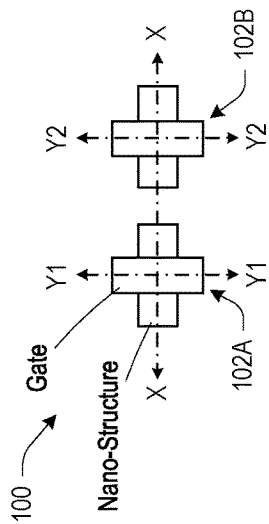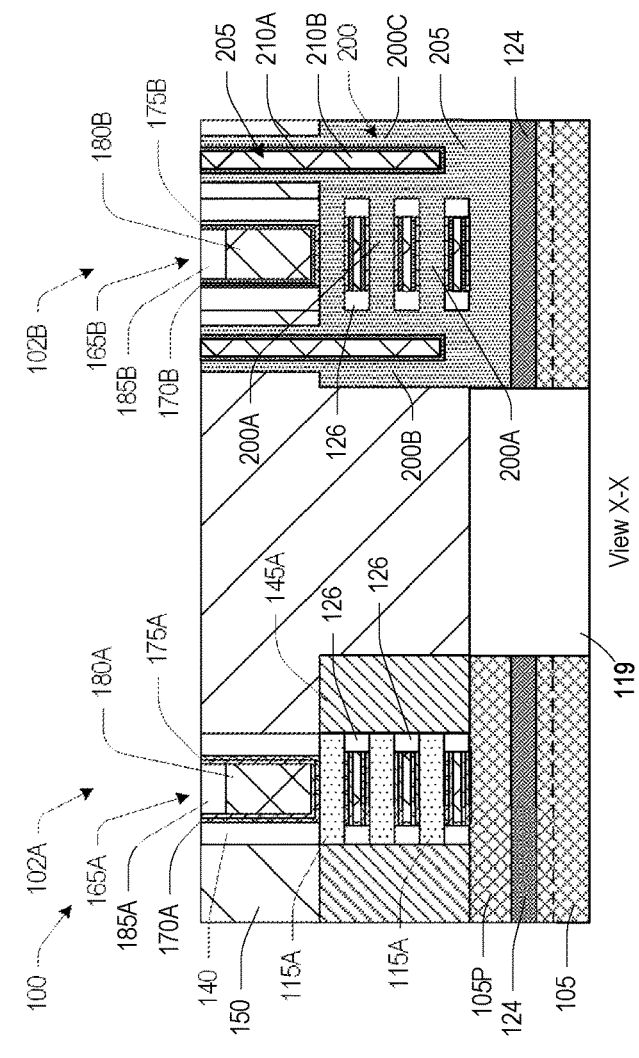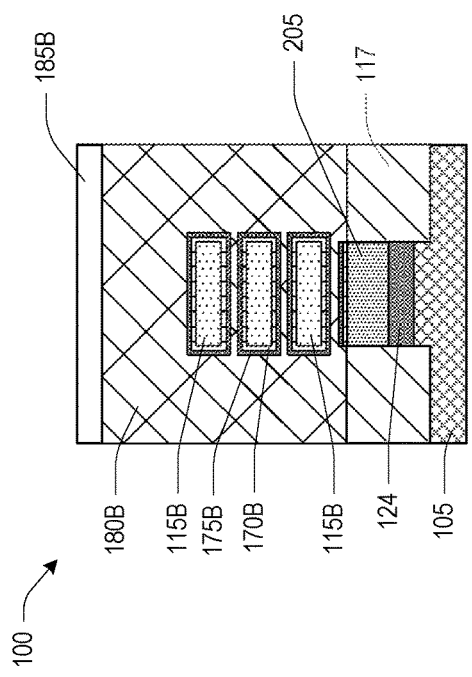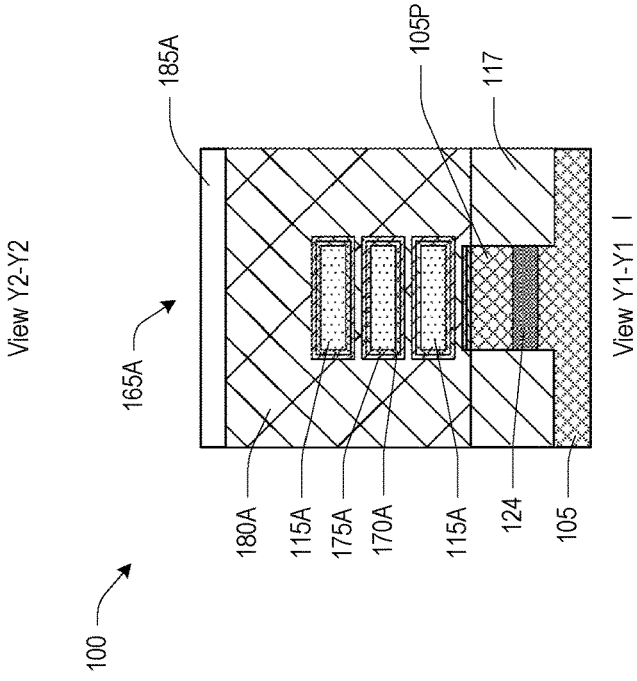
Fig. 14

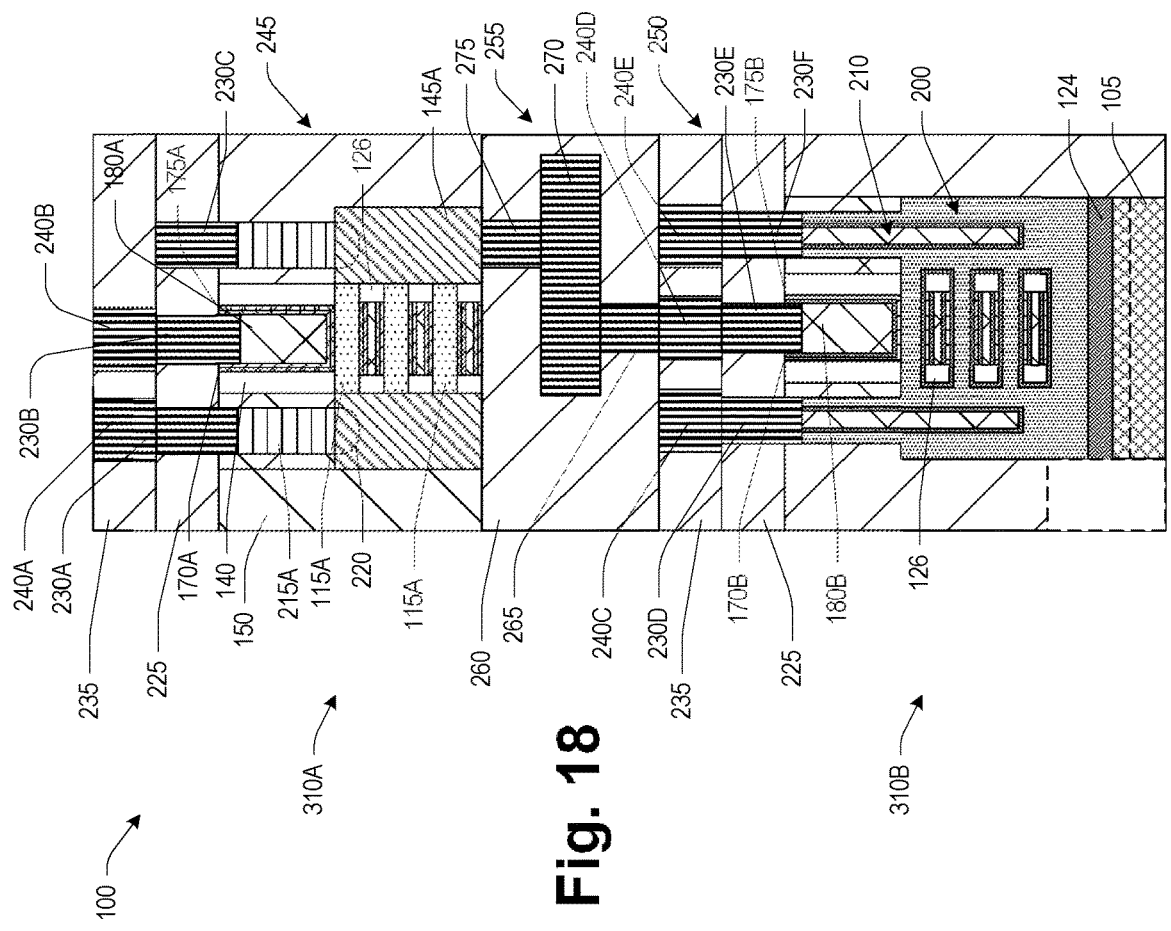
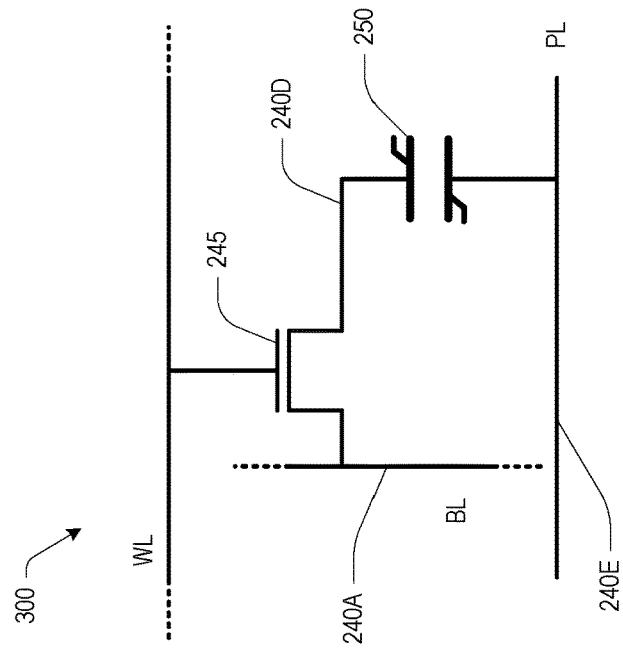
Fig. 18
Fig. 17

SEMICONDUCTOR STRUCTURE AND METHOD OF MANUFACTURE

RELATED APPLICATION

This application is a continuation of and claims priority to U.S. Non-Provisional application Ser. No. 17/394,456, titled "SEMICONDUCTOR STRUCTURE AND METHOD OF MANUFACTURE" and filed on Aug. 5, 2021, which claims priority to U.S. Provisional Application Ser. No. 63/179,157, titled "SEMICONDUCTOR ARRANGEMENT AND METHOD OF MANUFACTURE" and filed on Apr. 23, 2021. U.S. Non-Provisional application Ser. No. 17/394,456 and U.S. Provisional Application Ser. No. 63/179,157 are incorporated herein by reference.

BACKGROUND

As the semiconductor industry has progressed into nanometer technology process nodes in pursuit of higher device density, higher performance, and lower costs, challenges from both fabrication and design issues have resulted in the development of three dimensional designs, such as gate-all-around (GAA) transistors. A GAA transistor comprises one or more nano-sheet or nano-wire channel regions having a gate wrapped around the nano-sheet or nano-wire. GAA transistors can reduce the short channel effect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-16, 18, and 20 are illustrations of a semiconductor structure at various stages of fabrication, in accordance with some embodiments.

FIG. 17 is a circuit diagram of a bit cell, in accordance with some embodiments.

DETAILED DESCRIPTION

Figure 1:
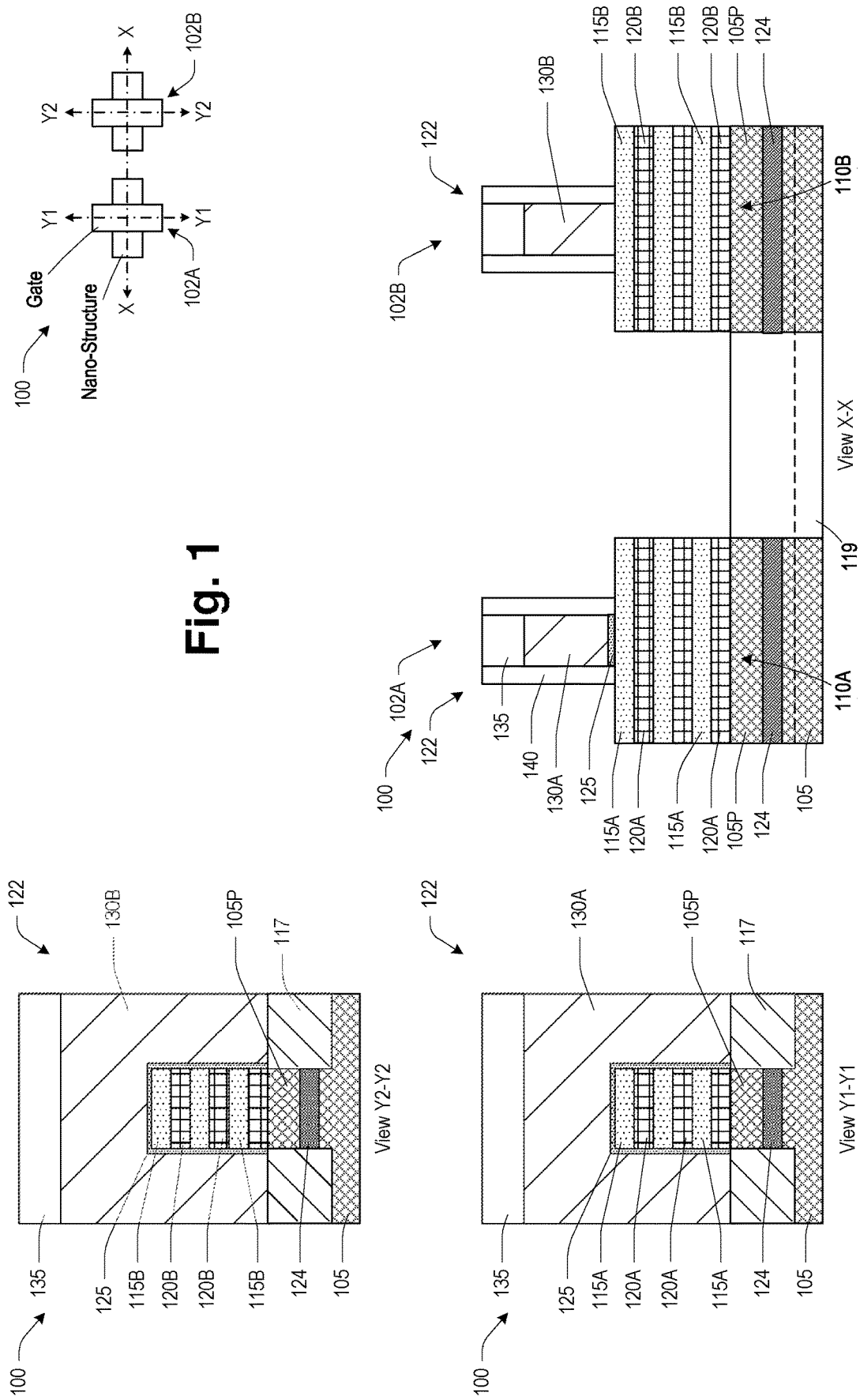

The following disclosure provides many different embodiments, or examples, for implementing different features of the provided subject matter. Specific examples of components and structures are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly.

One or more techniques for fabricating a semiconductor structure are provided herein. In some embodiments, the semiconductor structure comprises a nano-structure transistor and a nano-structure memory structure. As used herein, nano-structure devices, such as a nano-structure transistor or a nano-structure memory structure, refer to substantially flat, nearly two-dimensional structures, such as sometimes referred to as nano-sheets, as well as structures having two-dimensions that are similar in magnitude, such as sometimes referred to as nano-wires. Nano-sheet devices may have rectangular cross-sections and nano-wire devices may have elliptical cross-sections. A rectangular cross-section includes a square cross-section, and an elliptical cross-section includes a circular-cross section. In some embodiments, the nano-structure transistor and the nano-structure memory structure are formed in an integrated process flow. One or more of the nano-structure transistor and one or more of the nano-structure memory structure may be formed on different substrates, and a wafer bonding process may be performed to stack the nano-structure transistor(s) over the nano-structure memory structure(s).

FIGS. 1-9 are illustrations of a semiconductor structure 100 at various stages of fabrication, in accordance with some embodiments. FIGS. 1-9 include a simplistic plan view showing where various cross-sectional views are taken. Referring to FIG. 1, the view X-X is a cross-sectional view taken through the semiconductor structure 100 in a direction corresponding to a gate width direction through nano-structures formed in different regions, and the views Y1-Y1 and Y2-Y2 are cross-sectional views taken through the semiconductor structure 100 in a direction corresponding to a gate length direction through gate structures. Not all aspects of the processing shown in the cross-sectional views will be depicted in the plan view. In some embodiments, the structures shown in view Y1-Y1 are formed in a first region 102A of the semiconductor structure 100, and the structures shown in view Y2-Y2 are formed in a second region 102B of the semiconductor structure 100. The first region 102A may comprise transistor devices, and the second region 102B may comprise memory structures.

Referring to FIG. 1, a plurality of layers used in the formation of the semiconductor structure 100 are illustrated, in accordance with some embodiments. The plurality of layers is formed over a semiconductor layer 105. In some embodiments, the semiconductor layer 105 is part of a substrate comprising at least one of an epitaxial layer, a single crystalline semiconductor material such as, but not limited to, Si, Ge, SiGe, InGaAs, GaAs, InSb, GaP, GaSb, InAlAs, GaSbP, GaAsSb, and InP, a silicon-on-insulator (SOI) structure, a wafer, or a die formed from a wafer. The semiconductor layer 105 may also comprise crystalline silicon.

In some embodiments, a logic stack 110A and a memory stack 110B are formed by forming a first stack of semiconductor layers and performing an etch process to remove some of the first stack of semiconductor layers, thereby defining the logic stack 110A and the memory stack 110B. The logic stack 110A and the memory stack 110B may comprise channel semiconductor layers 115A, 115B and sacrificial semiconductor layers 120A, 120B. The materials of the channel semiconductor layers 115A, 115B may be different than the materials of the sacrificial semiconductor layers 120A, 120B to provide etch selectivity and allow removal of the sacrificial semiconductor layers 120A, 120B. In some embodiments, a spacing between adjacent logic stacks 110A (only one is shown) is between about 8-15 nm, and a spacing between adjacent memory stacks 110B (only one is shown) is between about 10-20 nm.

In some embodiments, an etch stop layer 124 is embedded in the semiconductor layer 105. An implant process may be performed to form the etch stop layer 124 in the semiconductor layer 105 or an epitaxial growth process may be performed to form the etch stop layer 124 over the semiconductor layer 105 and an additional portion of the semiconductor layer 105P is grown over the etch stop layer 124. The etch stop layer may comprise the same material as one of the sacrificial semiconductor layers 120A, 120B.

In some embodiments, the channel semiconductor layers 115A, 115B comprise the same material composition, and the sacrificial semiconductor layers 120A, 120B comprise the same material composition. The channel semiconductor layers 115A, 115B may comprise substantially pure silicon, and the sacrificial semiconductor layers 120A, 120B may comprise silicon-germanium ($Si_xGe_{(1-x)}$, where x ranges from 0.25 to 0.85). In other embodiments, the channel semiconductor layers 115A, 115B comprise SiGe and the sacrificial semiconductor layers 120A, 120B comprise silicon or SiGe with a different alloy concentration than the channel semiconductor layers 115A, 115B.

In some embodiments, the channel semiconductor layers 115A, 115B are different materials, and the sacrificial semiconductor layers 120A, 120B are different materials. The channel semiconductor layers 115A may comprise substantially pure silicon, and the channel semiconductor layers 115B may comprise silicon-germanium ($Si_xGe_{(1-x)}$, where x ranges from 0.25 to 0.85). The sacrificial semiconductor layers 120A, 120B may comprise different alloy concentrations of Ge to provide etch selectivity with respect to the channel semiconductor layers 115A, 115B.

In some embodiments, the number of channel semiconductor layers 115A, 115B and the number of sacrificial semiconductor layers 120A, 120B are more than three. The order of the channel semiconductor layers 115A, 115B and the sacrificial semiconductor layers 120A, 120B may vary. Thicknesses of the channel semiconductor layers 115A, 115B and the sacrificial semiconductor layers 120A, 120B may vary, and the thicknesses need not be the same. For example, the thicknesses of the channel semiconductor layers 115A, 115B and the sacrificial semiconductor layers 120A, 120B may decrease from the bottommost layers to the topmost layers.

In some embodiments, during the etch process to remove some of the stack of the channel semiconductor layers 115A, 115B and the sacrificial semiconductor layers 120A, 120B or during a subsequent etch process, a portion of the semiconductor layer 105 is etched to define a recess between the logic stack 110A and the memory stack 110B. An isolation structure 117, such as shallow trench isolation (STI), may be formed in the recess. The isolation structure 117 may be formed by depositing a dielectric layer between the adjacent logic stacks 110A and the adjacent memory stacks 110B and recessing the dielectric layer to expose at least portions of sidewalls of the logic stack 110A and the memory stack 110B. The isolation structure 117 comprises silicon and oxygen or other suitable dielectric materials.

A region 119 represents a demarcation between the first region 102A and the second region 102B. The region 119 may comprise an isolation structure. In some embodiments, the first region 102A is not immediately adjacent the second region 102B, and other structures may be present in the region 119. The first region 102A may be on one substrate and the second region 102B may be on another substrate.

In some embodiments, sacrificial gate structures 122 are formed over the logic stack 110A and the memory stack 110B and over the isolation structure 117. The sacrificial gate structures 122 may comprise a first gate dielectric layer 125 and sacrificial gate electrodes 130A, 130B. The first gate dielectric layer 125 comprises a high-k dielectric material or other suitable dielectric material. As used herein, the term "high-k dielectric" refers to the material having a dielectric constant, k, greater than or equal to about 3.9, which is the k value of $SiO_2$. The high-k dielectric material may be any suitable material. Examples of the high-k dielectric material include but are not limited to $Al_2O_3$, $HfO_2$, $ZrO_2$, $La_2O_3$, $TiO_2$, $SrTiO_3$, $LaAlO_3$, $Y_2O_3$, $Al_2O_xN_y$, $HfO_xN_y$, $ZrO_xN_y$, $La_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3, and each value of y is independently from 0 to 2.

In some embodiments, the first gate dielectric layer 125 comprises a native oxide layer formed by exposure of the semiconductor structure 100 to oxygen at various points in the process flow, causing the formation of silicon dioxide on exposed surfaces of the logic stack 110A and the memory stack 110B. An additional layer of dielectric material, such as a high-k dielectric material or other suitable material, may be formed over the native oxide to form the first gate dielectric layer 125. The sacrificial gate structures 122 may be formed by forming a layer of sacrificial material and a hard mask layer over the logic stack 110A and the memory stack 110B and the isolation structure 117. A patterning process may be performed to pattern the hard mask layer corresponding to the pattern of sacrificial gate structures 122 to be formed, and an etch process is performed using the patterned hard mask layer to etch a sacrificial layer to define the sacrificial gate electrodes 130A, 130B formed from the sacrificial layer, such as from a polysilicon layer. Remaining portions of the hard mask layer may form cap layers 135 over the sacrificial gate electrodes 130A, 130B.

In some embodiments, sidewall spacers 140 are formed adjacent the sacrificial gate structures 122. The sidewall spacers 140 may be formed by depositing a conformal spacer layer over the sacrificial gate structures 122 and performing an anisotropic etch process to remove portions of the conformal spacer layer positioned on horizontal surfaces of the cap layers 135, the logic stack 110A, the memory stack 110B, and the isolation structure 117. The sidewall spacers 140 may comprise the same material composition as the cap layer 135. The sidewall spacers 140 may comprise nitrogen and silicon or other suitable materials.

Referring to FIG. 2, the channel semiconductor layers 115A, 115B and the sacrificial semiconductor layers 120A, 120B are etched using the sidewall spacers 140 and the sacrificial gate structures 122 as an etch mask, in accordance with some embodiments.

Figure 3:
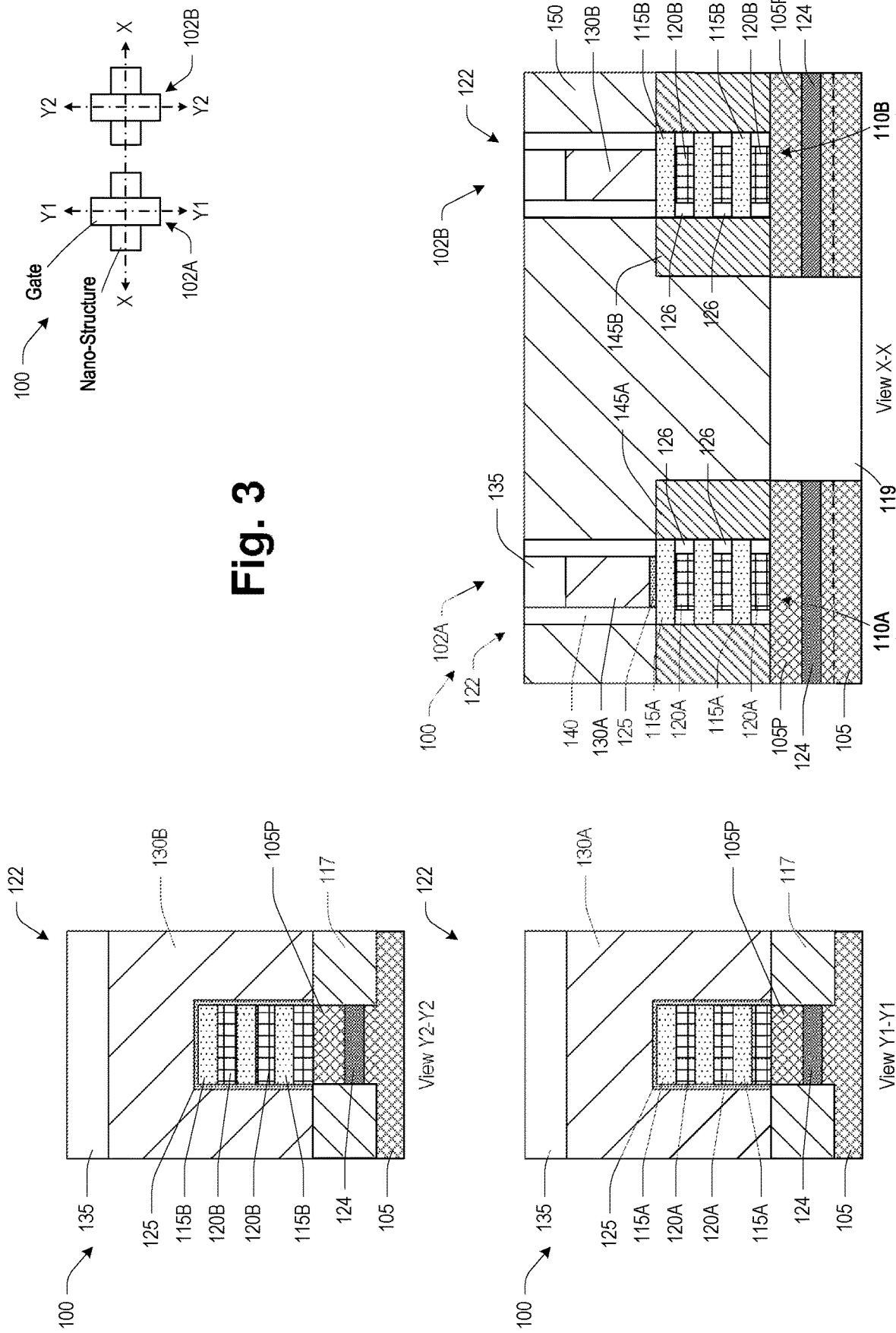

Referring to FIG. 3, end spacers 126 are formed adjacent ends of the sacrificial semiconductor layers 120A, 120B, source/drain regions 145A, 145B are formed in the logic stack 110A and the memory stack 110B, and a dielectric layer 150 is formed over the logic stack 110A and the memory stack 110B and adjacent the sacrificial gate structures 122, in accordance with some embodiments. After forming the logic stack 110A and the memory stack 110B, an isotropic etch process is performed to recess the sacrificial semiconductor layers 120A, 120B to define end cavities. A deposition process is performed to form a dielectric spacer layer over the logic stack 110A and the memory stack 110B and an isotropic etch process is performed to remove portions of the dielectric spacer layer outside the end cavities to define the end spacers 126. The end spacers 126 comprise a low-k dielectric material, for example, SiON, SiOCN, SiCN, SiOC, or some other suitable material. The end spacers 126 may comprise the same material composition as the sidewall spacers 140.

In some embodiments, the source/drain regions 145A, 145B are formed in the logic stack 110A and the memory stack 110B after forming the sacrificial gate structures 122 and after forming the end spacers 126. An epitaxial growth process may be performed to form the source/drain regions 145A, 145B. The source/drain regions 145A, 145B comprise SiP, SiC, or some other suitable material for an n-type device. The source/drain regions 145A, 145B comprise SiGe, SiB, or some other suitable material for a p-type device.

In some embodiments, the dielectric layer 150 is formed over the logic stack 110A and the memory stack 110B and adjacent the sacrificial gate structures 122 after forming the source/drain regions 145. A portion of the dielectric layer 150 may be removed, such as by planarization, to expose the cap layers 135. The dielectric layer 150 comprises silicon dioxide, a low-k dielectric material, one or more layers of low-k dielectric material, or some other suitable dielectric material. The materials for the dielectric layer 150 comprise at least one of Si, 0, C, or H, such as SiCOH and SiOC, or other suitable materials. Organic material such as polymers may be used for the dielectric layer 150. The dielectric layer 150 may comprise one or more layers of a carbon-containing material, organo-silicate glass, a porogen-containing material, or combinations thereof. The dielectric layer 150 may also comprise nitrogen. The dielectric layer 150 may be formed by using, for example, at least one of low pressure chemical vapor deposition (CVD) (LPCVD), atomic layer CVD (ALCVD), or a spin-on technology.

Figure 4:
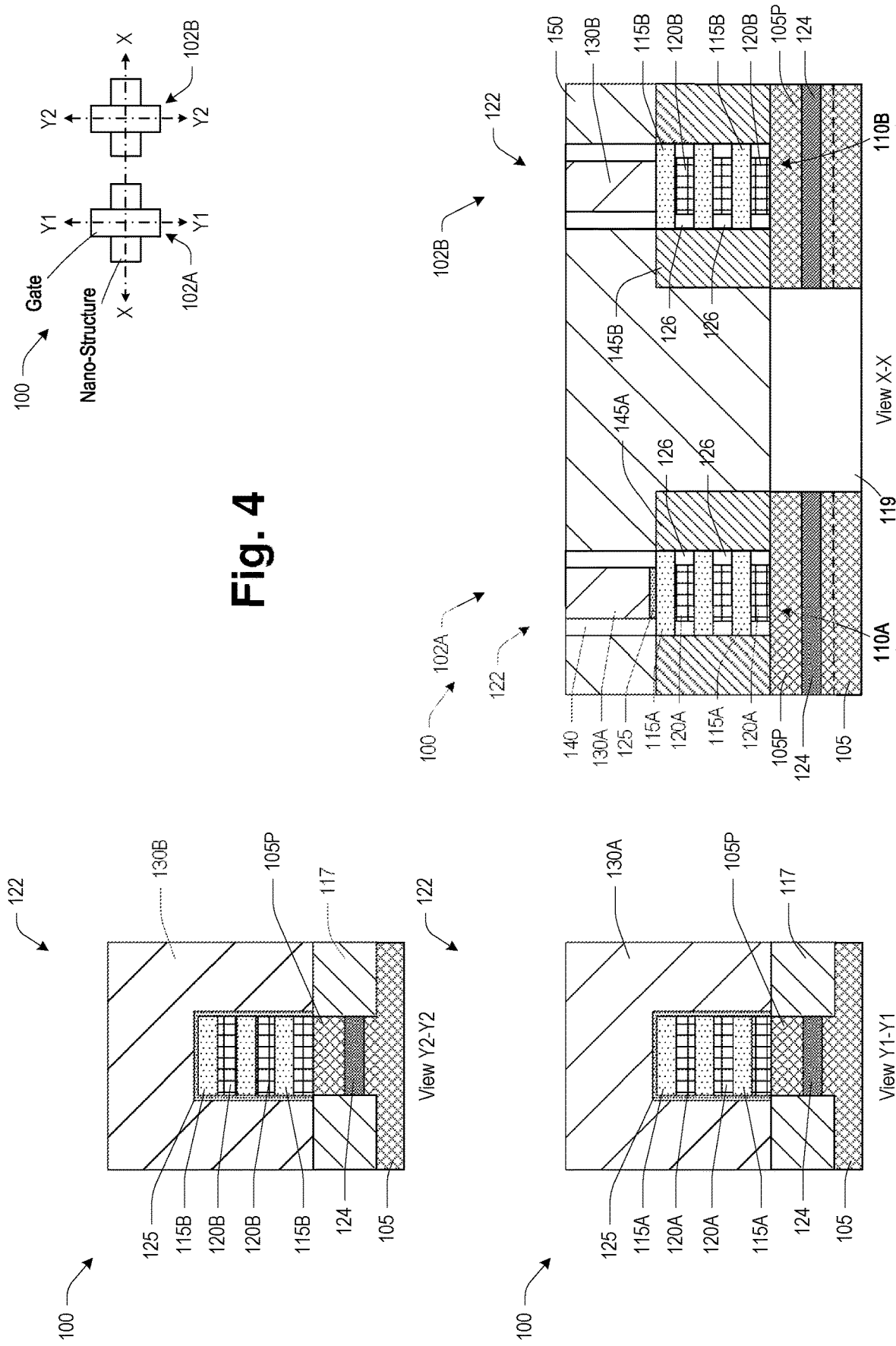

Referring to FIG. 4, the cap layers 135 are removed and heights of the sidewall spacers 140 and the dielectric layer 150 are reduced, in accordance with some embodiments. In some embodiments, a planarization process is performed to remove the cap layers 135 and to reduce the heights of the sidewall spacers 140 and the dielectric layer 150. The planarization process exposes the sacrificial gate electrodes 130A, 130B. The planarization process may be a continuation of the process performed to planarize the dielectric layer 150.

Referring to FIG. 5, the sacrificial gate electrode 130A and the first gate dielectric layer 125 are removed in the first region 102A to define a gate cavity 155A and expose portions of the logic stack 110A, in accordance with some embodiments. In some embodiments, a mask 160 is formed over the second region 102B to prevent removal of the sacrificial gate electrode 130B in the second region 102B. An etch process is performed to remove the sacrificial gate electrode 130A and the first gate dielectric layer 125. The etch process may be a wet etch process selective to the material of the sacrificial gate electrode 130A and the material of the first gate dielectric layer 125.

Referring to FIG. 6, at least some of the sacrificial semiconductor layers 120A are removed to define intermediate cavities 132A between the channel semiconductor layers 115A, in accordance with some embodiments. An etch process, such as a wet etch process, is performed to remove the sacrificial semiconductor layers 120A.

Referring to FIG. 7, the mask 160 is removed and a gate structure 165A is formed in the gate cavity 155A and the intermediate cavities 132A, in accordance with some embodiments. In some embodiments, the gate structure 165A comprises a gate dielectric layer 170A, a work function material layer 175A, and a gate electrode layer 180A. The gate dielectric layer 170A may comprise a high-k dielectric material. The gate dielectric layer 170A may comprise a native oxide layer formed by exposure of the semiconductor structure 100 to oxygen at various points in the process flow, causing the formation of silicon dioxide on exposed surfaces of the channel semiconductor layers 115A. An additional layer of dielectric material, such as a high-k dielectric material or other suitable material, is formed over the native oxide to form the gate dielectric layer 170A. The work function material layer 175A comprises TiN, TaN, WN, MoN, or some other suitable material for a p-type device, or AlC, TiAlC, TaAlC, TiSi, TaSi, WSi, CoSi, NiSi, or some other suitable material for an n-type device. The gate electrode layer 180A comprises a metal fill layer, such as tungsten (W) or other suitable material. The gate dielectric layer 170A, the work function material layer 175A, and/or the gate electrode layer 180A, and any other suitable layers of the gate structure 165A may be deposited by at least one of atomic layer deposition (ALD), physical vapor deposition (PVD), CVD, or other suitable processes. According to some embodiments, a planarization process is performed to remove portions of the material forming the gate structure 165A positioned over the dielectric layer 150. The gate structure 165A comprises a GAA gate structure.

Referring to FIG. 8, the sacrificial gate electrode 130B and the first gate dielectric layer 125 are removed in the second region 102B to define a gate cavity 155B and expose portions of the memory stack 110B, in accordance with some embodiments. In some embodiments, an etch process, such as a wet etch process selective to the material of the sacrificial gate electrode 130B and the material of the first gate dielectric layer 125, is performed to remove the sacrificial gate electrode 130B and the first gate dielectric layer 125.

Referring to FIG. 9, at least some of the sacrificial semiconductor layers 120B are removed to define intermediate cavities 132B between the channel semiconductor layers 115B, in accordance with some embodiments. An etch process, such as a wet etch process, is performed to remove the sacrificial semiconductor layers 120B.

Referring to FIG. 10, a memory element 165B is formed in the gate cavity 155B and the intermediate cavities 132B, in accordance with some embodiments. In some embodiments, the memory element 165B comprises a ferroelectric layer 170B, a work function material layer 175B, and an electrode layer 180B. The ferroelectric layer 170B comprises a material that exhibits spontaneous polarization in the presence of a magnetic field. The spontaneous polarization is persistent and reversible, allowing the ferroelectric layer 170B to function as a non-volatile memory storage layer. The ferroelectric layer 170B may be crystallized and have an orthorhombic phase. The ferroelectric layer 170B may comprise HfZrO, where the element ratios may vary. The HfZrO material may be formed using an ALD process using HfCl and ZrCl precursor gases. The ferroelectric layer 170B may comprise a native oxide layer formed by exposure of the semiconductor structure 100 to oxygen at various points in the process flow, causing the formation of silicon dioxide on exposed surfaces of the channel semiconductor layers 115B. A layer of ferroelectric material is formed over the native oxide to form the ferroelectric layer 170B. In some embodiments, the ALD process is performed using an artificial intelligence controlled process. A proportion of Zr in the HfZrO material may be between about 40% and 60%, and the ferroelectric layer 170B may have a thickness greater than about 3 nm. By controlling the proportion of Zr in the HfZrO material to be within the aforementioned range and the ferroelectric layer 170B to have a thickness greater than about 3 nm, the HfZrO has an orthorhombic phase that provides the HfZrO with ferromagnetic properties suitable for use in memory devices. The proportion of Zr in the HfZrO material and the thickness of the ferroelectric layer 170B are selected to enable reversibility of the polarity of the ferroelectric material. The ferroelectric layer 170B may have a thickness that varies. For example, a thickness of the ferroelectric layer 170B may be greater in a bottom region of the intermediate cavities 132B than in a top region of the intermediate cavities 132B and/or the gate cavity 155B.

The work function material layer 175B comprises TiN, AlC, or some other suitable material. The electrode layer 180B may comprise a metal fill layer, such as tungsten (W) or other suitable material. The work function material layer 175B, and/or the electrode layer 180B, and any other suitable layers of the memory element 165B may be deposited by at least one of ALD, PVD, CVD, or other suitable processes. A planarization process is performed to remove portions of the material forming the memory element 165B positioned over the dielectric layer 150.

Referring to FIG. 11, the gate structure 165A and the memory element 165B are recessed and cap layers 185A, 185B are formed over the gate structure 165A and the memory element 165B, respectively, in accordance with some embodiments. The gate structure 165A and the memory element 165B are recessed using an etch process. The cap layers 185A, 185B are formed using a deposition process. In some embodiments, the cap layers 185A, 185B comprise dielectric materials, such as materials comprising silicon and nitrogen, silicon and oxygen, or other suitable materials.

Referring to FIG. 12, openings 190 are formed in the dielectric layer 150 to expose the source/drain regions 145B, in accordance with some embodiments. In some embodiments, an etch process is performed to pattern the dielectric layer 150 using a mask as an etch template to form the openings 190. The etch process comprises at least one of a plasma etch process, a reactive ion etching (RIE) process, or other suitable techniques. The etch process comprises an anisotropic etch process in accordance with some embodiments.

Referring to FIG. 13, the source/drain regions 145B, the channel semiconductor layers 115B, and a portion of the semiconductor layer 105 over the etch stop layer 124 are removed to define a cavity 195 including intermediate cavities 195A, in accordance with some embodiments. An etch process, such as a wet etch process, is performed to remove the source/drain regions 145B, the channel semiconductor layers 115B, and the portion of the semiconductor layer 105P. The etch stop layer 124 serves as an etch barrier to define a boundary of the portion of the semiconductor layer 105P removed.

Referring to FIG. 14, an electrode 200 is formed in the openings 190 and in the cavity 195. In some embodiments, the electrode 200 comprises a channel semiconductor material 205 and a contact 210. The channel semiconductor material 205 may comprise indium gallium zinc oxide (IGZO) or be doped with aluminum. The contact 210 may comprise a work function material layer 210A and a fill layer 210B. The work function material layer 210A comprises TiN or some other suitable material. The fill layer 210B comprises tungsten or other suitable material. The channel semiconductor material 205, the work function material layer 210A, and/or the fill layer 210B may be deposited by ALD or other suitable processes. The ALD process may be performed using an artificial intelligence controlled process. The channel semiconductor material 205 may fill the openings 190 and the cavity 195 and an etch process may be performed to form recesses in the channel semiconductor material 205. The work function material layer 210A and the fill layer 210B are formed in the recesses in the channel semiconductor material 205 and a planarization process is performed to remove portions of the work function material layer 210A and the fill layer 210B positioned over the dielectric layer 150. In some embodiments, the electrode 200 comprises a sheet portion 200A formed in the intermediate cavities 195A, a first portion 200B, and a second portion 200C connected to the first portion 200B by the sheet portion 200A.

Figure 15:
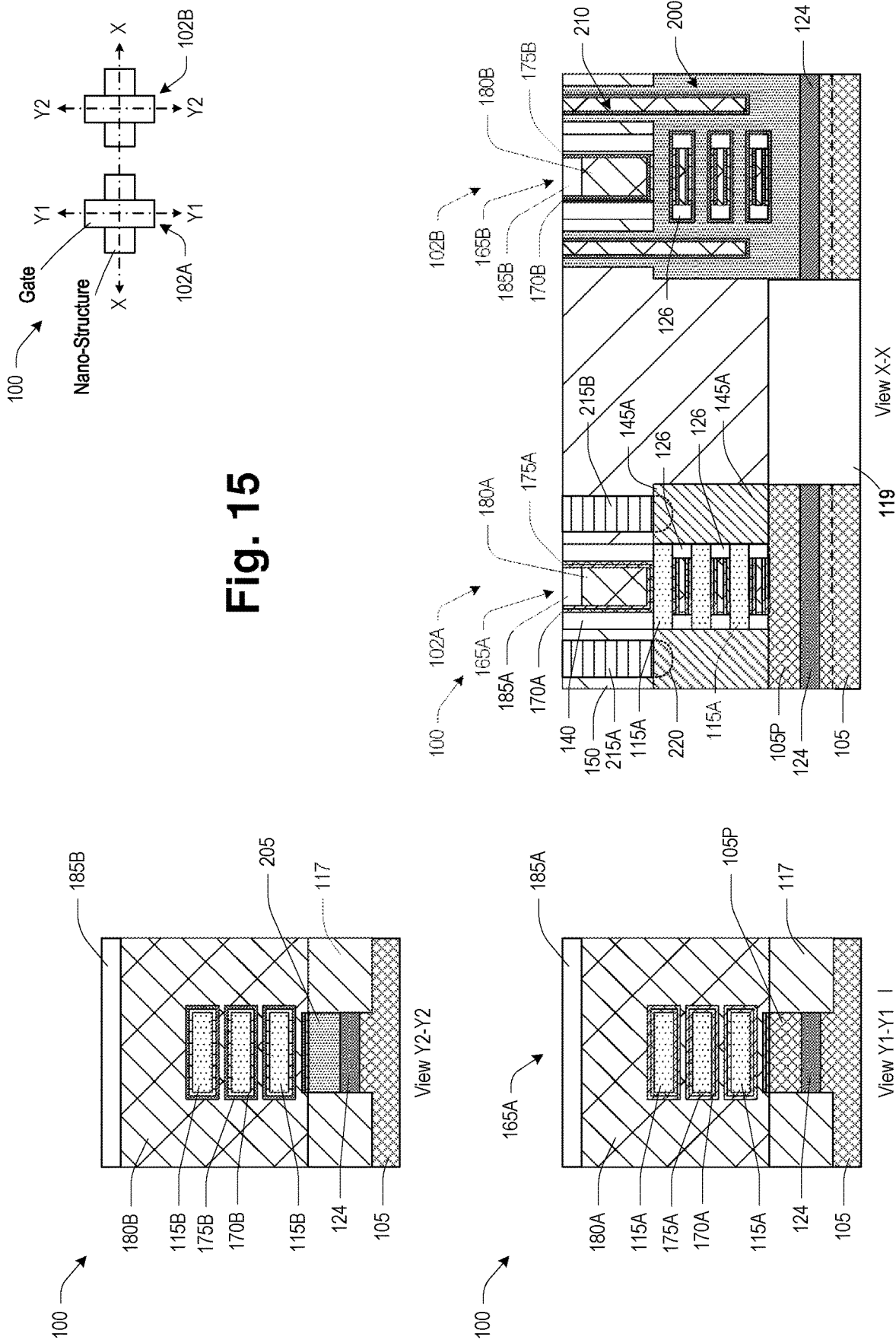

Referring to FIG. 15, source/drain contacts 215A, 215B are formed in the dielectric layer 150 over the source/drain regions 145A, in accordance with some embodiments. Openings are formed in the dielectric layer 150 to expose the source/drain regions 145A. In some embodiments, an etch process is performed to pattern the dielectric layer 150 using a mask as an etch template to form contact openings for the source/drain regions 145A. The etch process comprises at least one of a plasma etch process, a reactive ion etching (RIE) process, or other suitable techniques. The etch process comprises an anisotropic etch process in accordance with some embodiments. The source/drain contacts 215A, 215B may comprise a barrier layer and a metal fill layer (not separately shown). The barrier layer comprises TiN, AlC, or another suitable material. The metal fill layer comprises W, Co, Ru, Mo, Jr, or another suitable material. Silicide regions 220 may be formed in the source/drain regions 145A prior to forming the source/drain contacts 215A, 215B. The silicide regions 220 are formed by depositing a conformal layer of a refractory metal in the contact openings. The refractory metal comprises at least one of Ti, Ni, Co, Pd, Pt, or other suitable materials. An annealing process is performed to cause the refractory metal to react with underlying silicon-containing material in the source/drain regions 145A to form the silicide regions, which are a metal silicide, and an etch process is performed to remove unreacted portions of the layer of refractory metal. In some embodiments, an additional annealing process is performed to form a final phase of the metal silicide.

Figure 16:
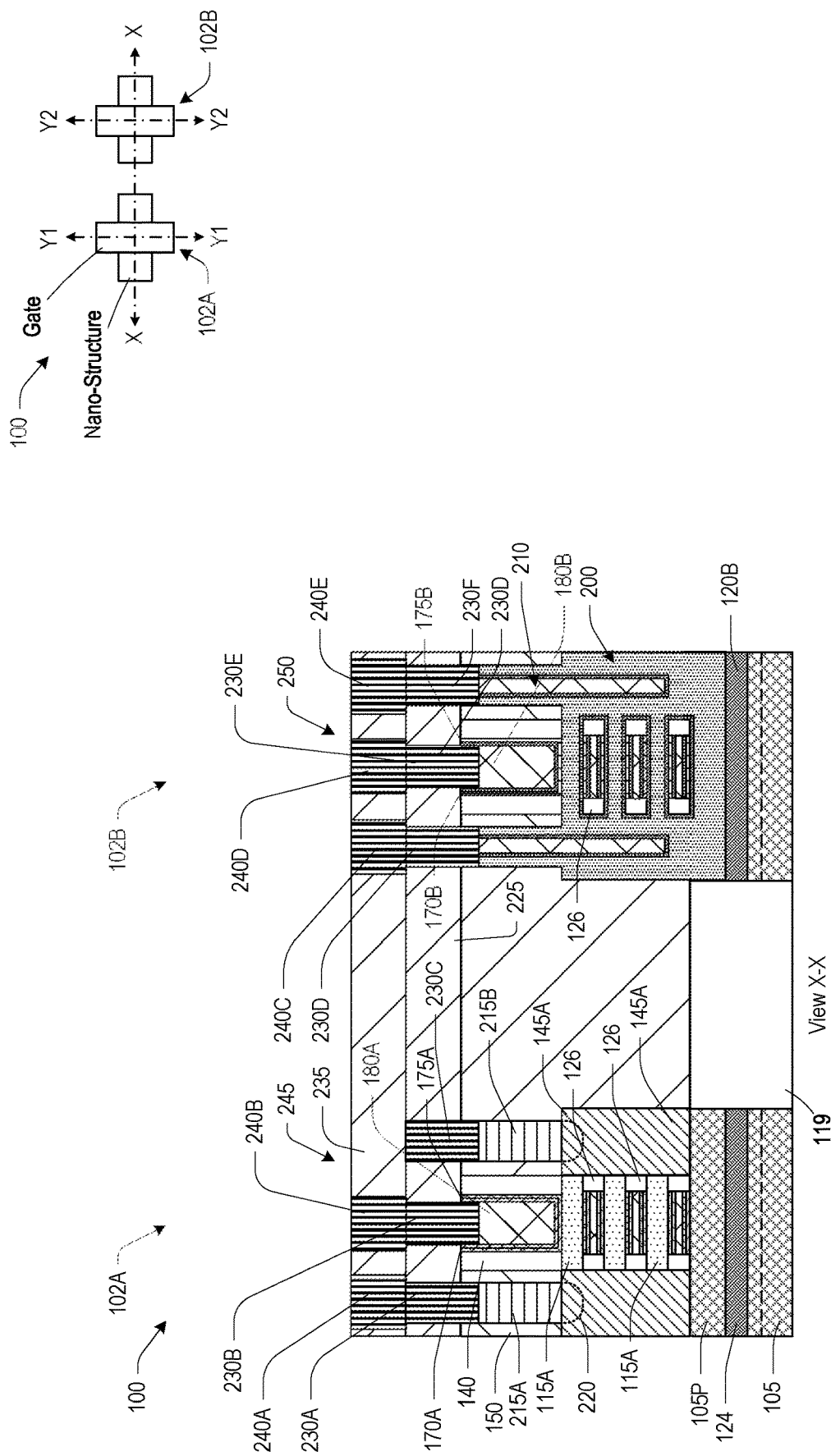

Referring to FIG. 16, a first metallization layer comprising a dielectric layer 225 and conductive vias 230A, 230B, 230C, 230D, 230E, 230F and a second metallization layer comprising a dielectric layer 235 and conductive lines 240A, 240B, 240C, 240D, 240E are formed over the dielectric layer 150, the gate structure 165A, and the memory element 165B, in accordance with some embodiments. The conductive vias 230A, 230B, 230C, 230D, 230E and the conductive lines 240A, 240B, 240C, 240D, 240E are formed in any number of ways, such as by a single damascene process, a dual damascene process, a trench silicide process, and/or other suitable techniques. In some embodiments, the conductive vias 230A, 230B, 230C, 230D, 230E and the conductive lines 240A, 240B, 240C, 240D, 240E comprise a barrier layer, a seed layer, a metal fill layer, and/or other suitable layers. The metal fill layer comprises W, Al, Cu, Co, and/or other suitable materials. Other structures and/or configurations of the conductive vias 230A, 230B, 230C, 230D, 230E and the conductive lines 240A, 240B, 240C, 240D, 240E are within the scope of the present disclosure. A portion of the cap layer 185A, 185B may be removed in the region where the conductive vias 230B, 230D interface with the gate electrode layer 180A and the electrode layer 180B, respectively. A cap layer (not visible) may be formed over the electrode 200, on portions located into and out of the page and not contacted by the conductive vias 230B, 230C, 230D.

According to some embodiments, the portion of the semiconductor structure 100 in the first region 102A comprises a transistor 245, and the portion of the semiconductor structure 100 in the second region 102B comprises a memory structure 250. The conductive via 230A and the conductive line 240A contact the source/drain contact 215A, the conductive via 230B and the conductive line 240B contact the gate electrode layer 180A (after removal of a portion of the cap layer 185A), the conductive vias 230C, 230E and the conductive lines 240C, 240E contact the contacts 210, and the conductive via 230D and the conductive line 240D contact the electrode layer 180B (after removal of a portion of the cap layer 185A). In some embodiments, a cap layer (not visible) is formed over the contacts 210 and the source/drain contacts 215A, 215B on portions located into and out of the page and not contacted by the conductive vias 230A, 230C, 230D, 230F. The cap layer is removed and the conductive vias 230A, 230C, 230D, and 230F extend into the region where the cap layer was removed.

Referring to FIG. 17, a circuit diagram of a bit cell 300 including the transistor 245 and the memory structure 250 is shown, according to some embodiments. The transistor 245 serves as an access device for the memory structure 250. In some embodiments, the conductive line 240A serves as a bit line, the conductive line 240D serves as a word line, and the conductive line 240E serves as a common ground line.

Referring to FIG. 18, according to some embodiments, the transistor 245 is formed on a first substrate 315A, the memory structure 250 is formed on a second substrate 315B, and a bonding process is performed on the first substrate 315A and the second substrate 315B to stack the transistor 245 over the memory structure 250. A redistribution layer 255 is formed between the transistor 245 and the memory structure 250 to electrically couple the transistor 245 and the memory structure 250. In some embodiments, the redistribution layer 255 comprises a dielectric layer 260, a conductive via 265, a conductive line 270, and a conductive via 275. A hybrid bonding may be performed using the redistribution layer 255 as the bonding interface. The conductive via 265 may contact the conductive line 240D, and the conductive via 275 contacts the source/drain region 145A of the transistor 245. A signal on a word line coupled to the conductive via 240B enables the transistor 245 and passes the signal on the word line through the source/drain region 145A, through the conductive via 275, the conductive line 270, the conductive via 265, the conductive line 240D, and the conductive via 230D to the electrode layer 180B to enable the memory structure 250. The value stored in the memory structure 250 is read through a bit line coupled to the conductive line 240C.

Figure 19:
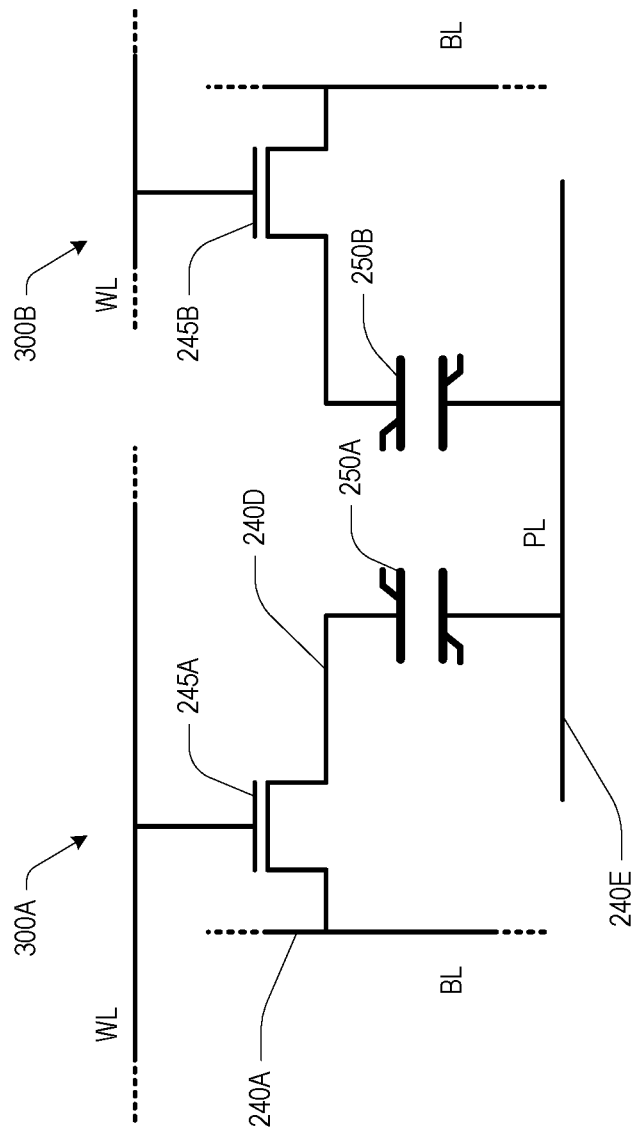
FIG. 19 is a circuit diagram of adjacent bit cells, in accordance with some embodiments.

Referring to FIG. 19, a circuit diagram of adjacent bit cells 300A, 300B including transistors 245A, 245B and memory structures 250A, 250B is shown, according to some embodiments. The transistors 245A, 245B serve as access devices for the respective memory structures 250A, 250B. In some embodiments, the conductive line 240E serves as a common ground line that is shared by the memory structures 250A, 250B.

Figure 20:
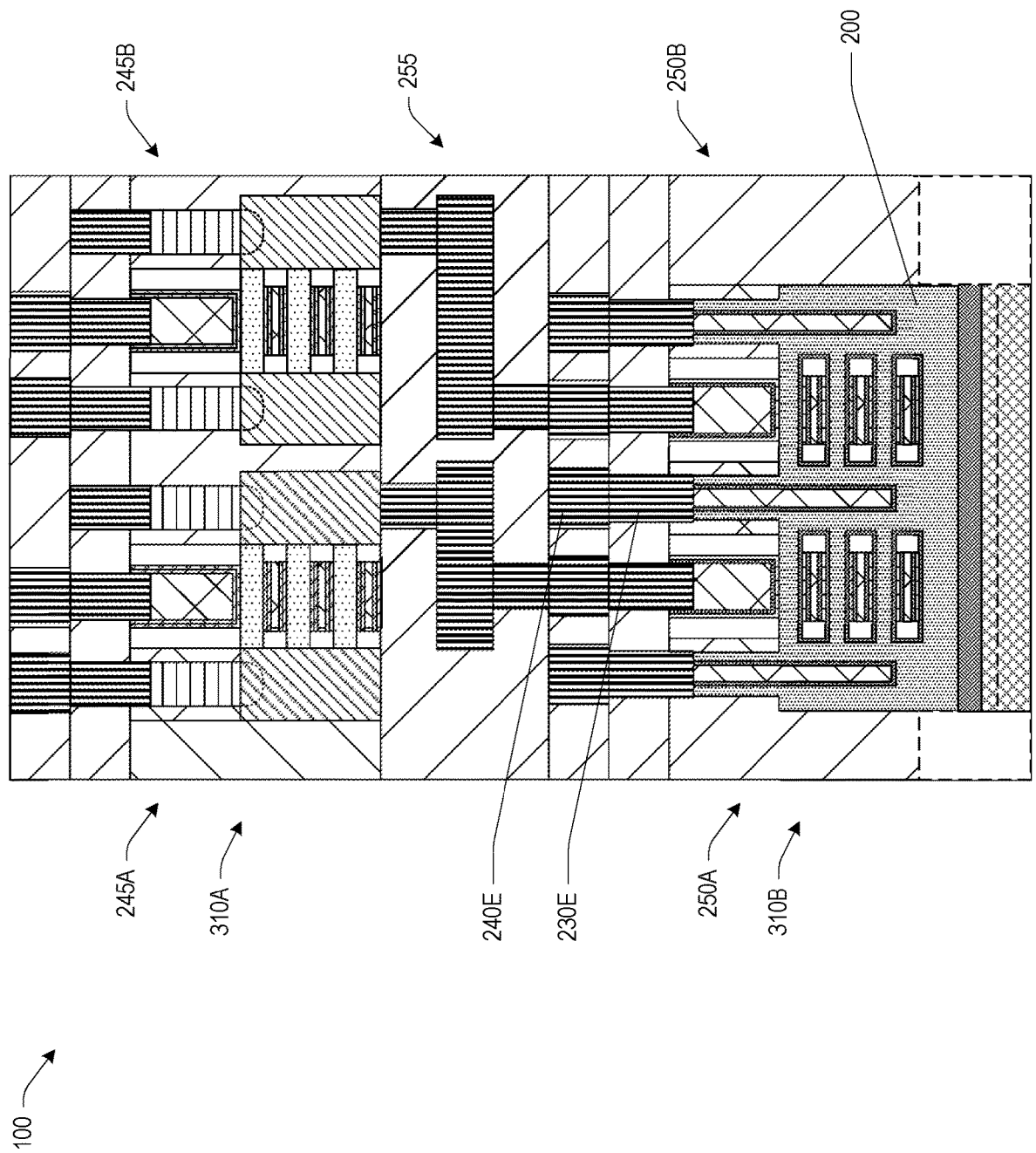

Referring to FIG. 20, according to some embodiments, the transistors 245A, 245B are formed on a first substrate 310A, the memory structures 250A, 250B are formed on second substrate 310B, and a bonding process is performed on the first substrate 315A and the second substrate 315B to stack the transistors 245A, 245B over the memory structures 250A, 250B using the redistribution layer 255. Note that the electrode 200 is shared by both memory structures 250A, 250B and the conductive line 240E serves as a common ground line for both memory structures 250A, 250B.

The transistor 245 and the memory structure 250 employ nano-structures that are formed using an integrated process flow. Stacking the transistor 245 and the memory structure 250 increases density. Process integration and increased density tend to increase device performance and value.

In some embodiments, a method for forming a semiconductor structure includes forming a first nano-structure device including a channel region and a sacrificial region. A second nano-structure device including a channel region and a sacrificial region is formed. A gate structure is formed over the channel region of the first nano-structure device. A memory element is formed adjacent the channel region of the second nano-structure device. The channel region of the second nano-structure device is replaced with a first electrode.

In some embodiments, a method for forming a semiconductor structure includes forming a first stack including a first semiconductor layer, a second semiconductor layer over the first semiconductor layer, and a third semiconductor layer over the second semiconductor layer. The first stack is patterned to define a memory stack. A first sacrificial gate electrode is formed over the memory stack. A first source/drain region is formed adjacent the memory stack. A dielectric layer is formed adjacent the first sacrificial gate electrode and over the memory stack. The first sacrificial gate electrode is removed to define a first gate cavity in the dielectric layer and to expose a first portion of the second semiconductor layer in the memory stack. The first portion of the second semiconductor layer in the memory stack is removed to define a first intermediate cavity between the first semiconductor layer and the third semiconductor layer. A ferroelectric layer is formed in the first gate cavity and the first intermediate cavity. A first electrode is formed in the first gate cavity and the first intermediate cavity over the ferroelectric layer. An opening is formed in the dielectric layer to expose the first source/drain region. The first source/drain region, the first semiconductor layer, and the third semiconductor layer are replaced with a second electrode.

In some embodiments, a semiconductor structure includes a first electrode comprising a first portion, a second portion, and a sheet portion connecting the first portion to the second portion. A ferroelectric material is over the sheet portion. A second electrode is over the ferroelectric material.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor structure, comprising:
   a first electrode extending between a first end spacer and a second end spacer;
   a ferroelectric material extending between the first end spacer and the second end spacer, wherein the ferroelectric material is below the first electrode and above the first electrode; and
   a second electrode, wherein the second electrode is spaced apart from the first electrode on a first side of the first electrode by the first end spacer, is spaced apart from the first electrode on a second side of the first electrode by the second end spacer, is spaced apart from the first electrode on a bottom of the first electrode by the ferroelectric material and is spaced apart from the first electrode on a top of the first electrode by the ferroelectric material.

2. The semiconductor structure of claim 1, comprising:
   a work function metal layer extending between the first end spacer and the second end spacer.

3. The semiconductor structure of claim 2, wherein the work function metal layer is between the first electrode and the ferroelectric material.

4. The semiconductor structure of claim 1, wherein the ferroelectric material is in direct contact with the second electrode.

5. The semiconductor structure of claim 1, wherein the ferroelectric material comprises HfZrO.

6. The semiconductor structure of claim 1, wherein a material of the ferroelectric material is selected to have an orthorhombic phase.

7. The semiconductor structure of claim 1, comprising:
   a sidewall spacer, wherein the sidewall spacer is between the first electrode and a contact of the second electrode.

8. The semiconductor structure of claim 7, comprising:
   a dielectric layer, wherein the dielectric layer is between the sidewall spacer and the contact of the second electrode.

9. The semiconductor structure of claim 7, wherein the ferroelectric material is between the first electrode and the sidewall spacer.

10. The semiconductor structure of claim 1, wherein the second electrode comprises a channel semiconductor material and a contact.

11. The semiconductor structure of claim 10, wherein the channel semiconductor material comprises indium gallium zinc oxide.

12. The semiconductor structure of claim 10, wherein the contact comprises a work function material layer and a fill layer.

13. A semiconductor structure, comprising:
    a first electrode;
    a ferroelectric material;
    a sidewall spacer, wherein the ferroelectric material is between the first electrode and the sidewall spacer; and
    a second electrode, wherein the sidewall spacer is between the second electrode and the ferroelectric material.

14. The semiconductor structure of claim 13, comprising:
    a work function material layer between the first electrode and the ferroelectric material.

15. The semiconductor structure of claim 13, wherein:
    the second electrode comprises a contact and a channel semiconductor material, the sidewall spacer is between the contact and the ferroelectric material, and the channel semiconductor material is between a first portion of the first electrode and a second portion of the first electrode.

16. The semiconductor structure of claim 15, wherein:

the ferroelectric material underlies the first portion of the first electrode, the channel semiconductor material underlies the ferroelectric material, and the second portion of the first electrode underlies the channel semiconductor material.

17. A method of forming a semiconductor structure, comprising:

forming a first source/drain region and a second source/drain region, wherein a channel semiconductor material extends between the first source/drain region and the second source/drain region;

removing the first source/drain region, the second source/drain region, and the channel semiconductor material to expose a ferroelectric material; and forming a first electrode over the ferroelectric material and under the ferroelectric material.

18. The method of claim 17, wherein:

the ferroelectric material is between a first end spacer and a second end spacer, and removing the first source/drain region, the second source/drain region, and the channel semiconductor material exposes the first end spacer and the second end spacer.

19. The method of claim 18, wherein forming the first electrode comprises forming the first electrode adjacent to the first end spacer.

20. The method of claim 17, comprising:

forming a second electrode and the ferroelectric material after forming the first source/drain region and the second source/drain region and before removing the first source/drain region, the second source/drain region, and the channel semiconductor material.

\* \* \* \* \*